(12) United States Patent
Kobayashi et al.

(10) Patent No.: US 10,821,994 B2
(45) Date of Patent: Nov. 3, 2020

(54) ON-BOARD CONTROL DEVICE, ON-BOARD INTEGRATED CIRCUIT

(71) Applicant: Hitachi Automotive Systems, Ltd., Hitachinaka (JP)

(72) Inventors: Youichirou Kobayashi, Hitachinaka (JP); Masahito Sonehara, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 307 days.

(21) Appl. No.: 15/569,152

(22) PCT Filed: Jul. 6, 2016

(86) PCT No.: PCT/JP2016/069959
§ 371 (c)(1),
(2) Date: Oct. 25, 2017

(87) PCT Pub. No.: WO2017/018140
PCT Pub. Date: Feb. 2, 2017

(65) Prior Publication Data
US 2018/0141566 A1    May 24, 2018

(30) Foreign Application Priority Data
Jul. 29, 2015   (JP) .................................. 2015-149170

(51) Int. Cl.
*B60W 50/02*     (2012.01)
*B60R 16/02*     (2006.01)
(Continued)

(52) U.S. Cl.
CPC ......... *B60W 50/0205* (2013.01); *B60R 16/02* (2013.01); *B60R 16/0232* (2013.01);
(Continued)

(58) Field of Classification Search
CPC ............ B60W 50/0205; B60W 50/14; B60W 50/029; B60W 50/0225;
(Continued)

(56) References Cited

U.S. PATENT DOCUMENTS 4,430,735 A * 2/1984 Catiller .................. G11C 29/04
714/719
5,594,444 A * 1/1997 Yamada ................ H03M 1/206
341/159
(Continued)

FOREIGN PATENT DOCUMENTS

CN          101010594 A       8/2007
JP          63-094174 A       4/1988
(Continued)

OTHER PUBLICATIONS

Google Patent Search Results, Nov. 18, 2019, Nov. 20, 2019.*
(Continued)

*Primary Examiner* — Jeff A Burke
*Assistant Examiner* — Kyle T Johnson
(74) *Attorney, Agent, or Firm* — Crowell & Moring LLP

(57) ABSTRACT

Provided is a semiconductor integrated circuit which can continuously and stably generate an output value even after shipment and a vehicle-mounted control device using the semiconductor integrated circuit. The present invention includes a reference signal generation unit for outputting a reference signal, and detects the operation state of a semiconductor circuit on the basis of a difference between output values from the semiconductor circuit corresponding to the reference signals output at two different time points by the reference signal generation unit.

11 Claims, 24 Drawing Sheets

(51) Int. Cl.
*G01R 31/28* (2006.01)
*H03M 1/10* (2006.01)
*H01L 21/822* (2006.01)
*G06F 11/22* (2006.01)
*H01L 27/04* (2006.01)
*B60R 16/023* (2006.01)
*B60W 50/029* (2012.01)
*B60W 50/14* (2020.01)
*G01R 31/317* (2006.01)

(52) U.S. Cl.
CPC ...... *B60W 50/029* (2013.01); *B60W 50/0225* (2013.01); *B60W 50/14* (2013.01); *G01R 31/28* (2013.01); *G01R 31/2856* (2013.01); *G01R 31/31703* (2013.01); *G01R 31/31721* (2013.01); *G06F 11/22* (2013.01); *H01L 21/822* (2013.01); *H01L 27/04* (2013.01); *H03M 1/10* (2013.01); *B60W 2050/021* (2013.01); *B60W 2050/0215* (2013.01); *B60W 2050/0292* (2013.01)

(58) Field of Classification Search
CPC . B60W 2050/0292; B60W 2050/0215; B60W 2050/021; B60R 16/02; B60R 16/0232; G01R 31/2856; G01R 31/28; G01R 31/31721; G01R 31/31703; G06F 11/22; H01L 27/04; H01L 21/822; H03M 1/10
See application file for complete search history.

(56) References Cited

U.S. PATENT DOCUMENTS

| | | | | | |
|---|---|---|---|---|---|
| 5,926,445 | A * | 7/1999 | Sasaki | ............ | G11B 7/094 369/44.11 |
| 6,297,679 | B1 * | 10/2001 | Kim | ............ | H03K 5/135 327/276 |
| 6,791,389 | B2 * | 9/2004 | Mikami | ............ | G01R 31/31937 327/276 |
| 7,205,854 | B2 * | 4/2007 | Liu | ............ | G01R 31/31703 324/750.3 |
| 7,221,131 | B2 * | 5/2007 | Ozawa | ............ | H02M 3/156 323/272 |
| 7,402,988 | B2 * | 7/2008 | Chiu | ............ | H02M 3/157 323/283 |
| 8,390,313 | B2 * | 3/2013 | Ikenaga | ............ | H03K 19/00392 324/76.77 |
| 8,497,794 | B2 * | 7/2013 | Etou | ............ | H03M 1/0604 323/291 |
| 8,947,117 | B2 * | 2/2015 | Yanagishima | ............ | H02P 31/00 324/762.01 |
| 9,019,006 | B2 * | 4/2015 | Morie | ............ | H03M 1/12 327/313 |
| 2002/0027828 | A1 * | 3/2002 | Ikeda | ............ | G11C 7/1078 365/230.08 |
| 2007/0005202 | A1 * | 1/2007 | Breed | ............ | B60W 50/0205 701/29.1 |
| 2007/0075792 | A1 * | 4/2007 | Liu | ............ | G01R 31/2856 331/57 |
| 2007/0296446 | A1 * | 12/2007 | Ishii | ............ | G01R 31/31919 324/762.02 |
| 2008/0129562 | A1 | 6/2008 | Nakahira et al. | | |
| 2011/0241725 | A1 | 10/2011 | Ikenaga et al. | | |
| 2011/0241913 | A1 * | 10/2011 | Ikeda | ............ | H03M 1/12 341/118 |
| 2011/0295549 | A1 * | 12/2011 | Takabayashi | ............ | G01S 7/4004 702/142 |
| 2012/0268302 | A1 | 10/2012 | Etou et al. | | |
| 2013/0002274 | A1 * | 1/2013 | Saneyoshi | ............ | G01R 31/2849 324/750.01 |
| 2013/0076401 | A1 * | 3/2013 | Lee | ............ | H03K 5/153 327/77 |
| 2014/0062750 | A1 | 3/2014 | Morie et al. | | |
| 2015/0137843 | A1 * | 5/2015 | Yanagishima | ............ | H04L 25/028 324/750.3 |
| 2015/0303935 | A1 * | 10/2015 | Nishikawa | ............ | G01D 3/022 702/198 |
| 2017/0149253 | A1 * | 5/2017 | Takahashi | ............ | H01M 4/5825 |
| 2018/0141566 | A1 * | 5/2018 | Kobayashi | ............ | B60W 50/0225 |
| 2018/0239307 | A1 * | 8/2018 | Tsutsumi | ............ | H03L 7/087 |
| 2019/0334522 | A1 * | 10/2019 | Yanagishima | ............ | G01R 31/27 |

FOREIGN PATENT DOCUMENTS

| | | |
|---|---|---|
| JP | 2005-244771 A | 9/2005 |
| JP | 2008-276702 A | 11/2008 |
| JP | 2011-147084 A | 7/2011 |
| JP | 2011-217007 A | 10/2011 |
| JP | 2007-309773 A | 11/2011 |
| WO | WO 2012/157155 A1 | 11/2012 |

OTHER PUBLICATIONS

IP.com Search Results Nov. 18, 2019.*
Espacenet.com Search Results, Nov. 19, 2019 Nov. 20, 2019.*
Espacenet_circuit_storage_OPT (Year: 2019).*
Espacenet_input_buffer_OPT (Year: 2019).*
G_Pat_General_search_OPT (Year: 2019).*
Google_Patent_AD_Converter_OPT (Year: 2019).*
IP_Search_Circuit_OPT (Year: 2019).*
Combined NPL Scanned Documents (Year: 2019).*
International Search Report (PCT/ISA/210) issued in PCT Application No. PCT/JP2016/069959 dated Oct. 25, 2016 with English translation (Four (4) pages).
Japanese-language Written Opinion (PCT/ISA/237) issued in PCT Application No. PCT/JP2016/069959 dated Oct. 25, 2016 (Four (4) pages).
Extended European Search Report issued in counterpart European Application No. 16830245.3 dated Feb. 21, 2019 (nine (9) pages).
Chinese-language Office Action issued in Chinese Application No. 201680025210.3 dated May 29, 2020 with partial English translation (11 pages).

* cited by examiner

ON-BOARD CONTROL DEVICE, ON-BOARD INTEGRATED CIRCUIT

TECHNICAL FIELD

The present invention relates to a vehicle-mounted integrated circuit and a vehicle-mounted control device using the vehicle-mounted integrated circuit.

BACKGROUND ART

In recent years, various devices mounted on vehicles have been electronically controlled, and, for example, in function of monitoring output values from power generation units, sensors, or drive devices of vehicle-mounted control devices, semiconductor integrated circuits have been widely used.

A long time operation of these semiconductor integrated circuits gradually changes the characteristics thereof due to influence of hot carrier, negative bias temperature instability (NBTI), wire migration, or the like, and thus, the characteristics of vehicle-mounted control devices may be deteriorated and the deterioration may influence vehicle control.

Technologies for detecting the presence/absence of failure by self tests or the like for semiconductor integrated circuits after shipment have been disclosed. For example, the following PTL 1 describes a semiconductor integrated circuit "configured to supply outputs at three levels of the high level, the low level, and the intermediate level generated by the diagnostic signal generation circuit, to an analog signal input terminal of the A/D converter to perform A/D conversion, the semiconductor integrated circuit diagnosing success or failure in performance of the A/D converter on the basis of a digital output from the A/D converter" (see claim 1).

CITATION LIST

Patent Literature

PTL 1: JP 2007-309773 A

SUMMARY OF INVENTION

Technical Problem

In PTL 1, as seen from the description "diagnosing success or failure in performance of the A/D converter on the basis of a digital output from the A/D converter", normal operation disabled by an abnormal condition generated in the circuit can be detected, but detection of a change in characteristics due to the age deterioration or the like of the circuit is not taken into consideration. Therefore, the lifetimes of the semiconductor integrated circuit and a vehicle-mounted control device using the semiconductor integrated circuit may be reduced relative to expected lifetimes thereof.

The present invention has been made in view of the above problems, and an object of the present invention is to provide a semiconductor integrated circuit which can continuously and stably generate an output value even after shipment and a vehicle-mounted control device using the semiconductor integrated circuit.

Solution to Problem

The present invention includes a reference signal generation unit for outputting a reference signal, and detects the operation state of a semiconductor circuit on the basis of a difference between output values from the semiconductor circuit corresponding to the reference signals output at two different time points by the reference signal generation unit.

Advantageous Effects of Invention

According to the present invention, even when the characteristics of a semiconductor circuit varies with time, the variation can be detected and output values can be stably generated continuously. Problems, configurations, and effects other than the above description will be made clear by the following description of the embodiments.

DESCRIPTION OF EMBODIMENTS

First Embodiment

Figure 1:
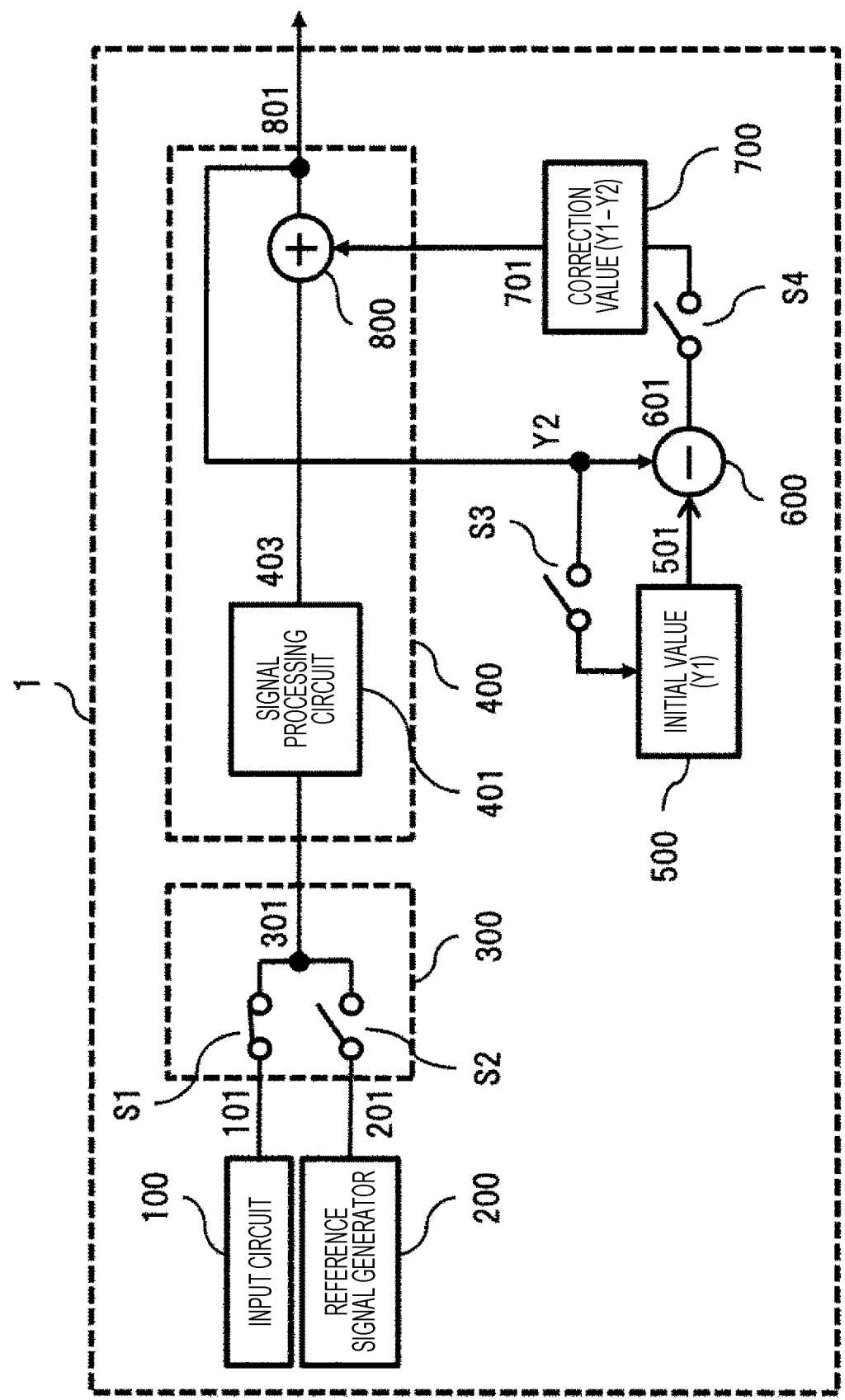
FIG. 1 is a block diagram illustrating a configuration of a semiconductor integrated device 1 according to a first embodiment.

FIG. 1 is a block diagram illustrating a configuration of a semiconductor integrated device 1 according to a first embodiment of the present invention. The semiconductor integrated device 1 is a device mounted, for example, on a vehicle and outputting a signal used to control a vehicle-mounted device. The semiconductor integrated device 1 includes an input circuit 100, a reference signal generator 200, an input switching circuit 300, a semiconductor circuit 400, an initial value storage circuit 500, a difference operation circuit 600, a correction-value storage circuit 700, a write circuit S3, and a write circuit S4.

The input circuit 100 is a circuit, such as a sensor circuit of a vehicle-mounted control device or a drive current monitoring circuit of an electromagnetic load drive device, for providing a signal being an input value to the semiconductor circuit 400. The reference signal generator 200 generates a reference signal used as a reference for measurement of a characteristic variation of the semiconductor circuit 400 over time. The input switching circuit 300 includes switching circuits S1 and S2, and switches the switching circuits S1 and S2 to transmit an output 101 from the input circuit 100 or a reference signal 201 from the reference signal generator 200 to the semiconductor circuit 400. The semiconductor circuit 400 is a circuit for outputting a signal used to control, for example, a vehicle-mounted device, and includes a signal processing circuit 401 and a correction circuit 800. The initial value storage circuit 500 is a storage element, such as a memory device, and stores an output value from the correction circuit 800. The write circuit S3 switches writing of a value to the initial value storage circuit 500. The difference operation circuit 600 calculates a difference between an output 501 from the initial value storage circuit 500 and an output 801 from the correction circuit 800. The correction-value storage circuit 700 is a storage element, such as a register, and stores an output 601 from the difference operation circuit 600. The write circuit S4 switches writing of a value to the correction-value storage circuit 700.

The signal processing circuit 401 is a circuit performing for example signal conversion on an output 301 from the input switching circuit 300, and includes, for example, an AD converter. The correction circuit 800 uses an output 701 from the correction-value storage circuit 700 to correct an output 403 from the signal processing circuit 401 (e.g., add both outputs to correct a difference between both output values), and generates an output 801 as a result of the correction.

Figure 2:
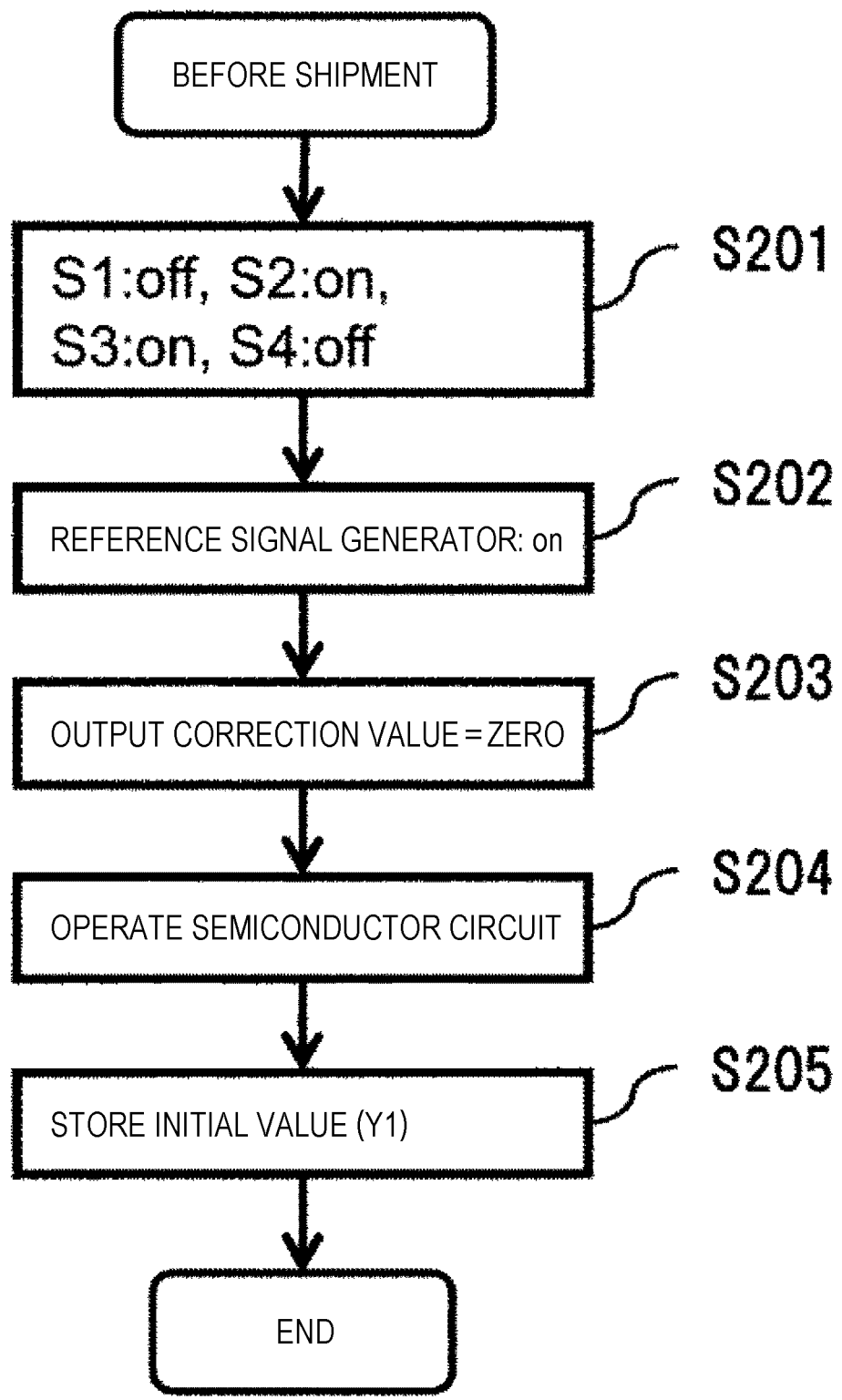
FIG. 2 is a flowchart illustrating operation of the semiconductor integrated device 1 before shipment.

FIG. 2 is a flowchart illustrating operation of the semiconductor integrated device 1 before shipment. Before shipment, the semiconductor integrated device 1 turns off the switching circuit S1, turns on the switching circuit S2, turns on the write circuit S3, and turns off the write circuit S4 (S201). The semiconductor integrated device 1 activates the reference signal generator 200 (S202). The semiconductor integrated device 1 sets an output 701 from the correction-value storage circuit 700 to zero (S203). When the semiconductor circuit 400 is operated in this condition (S204), the semiconductor circuit 400 outputs an output value Y1 according to the reference signal 201 from the reference signal generator 200, and Y1 is stored in the initial value storage circuit 500 (S205).

The flowchart of FIG. 2 has significance in storage of an output value from the semiconductor circuit 400, at a time point before shipment of the semiconductor integrated device 1 (i.e., before the characteristic variation of the semiconductor circuit 400 over time). Accordingly, this operation is preferably performed, for example, in a release test for the semiconductor integrated device 1.

Figure 3:
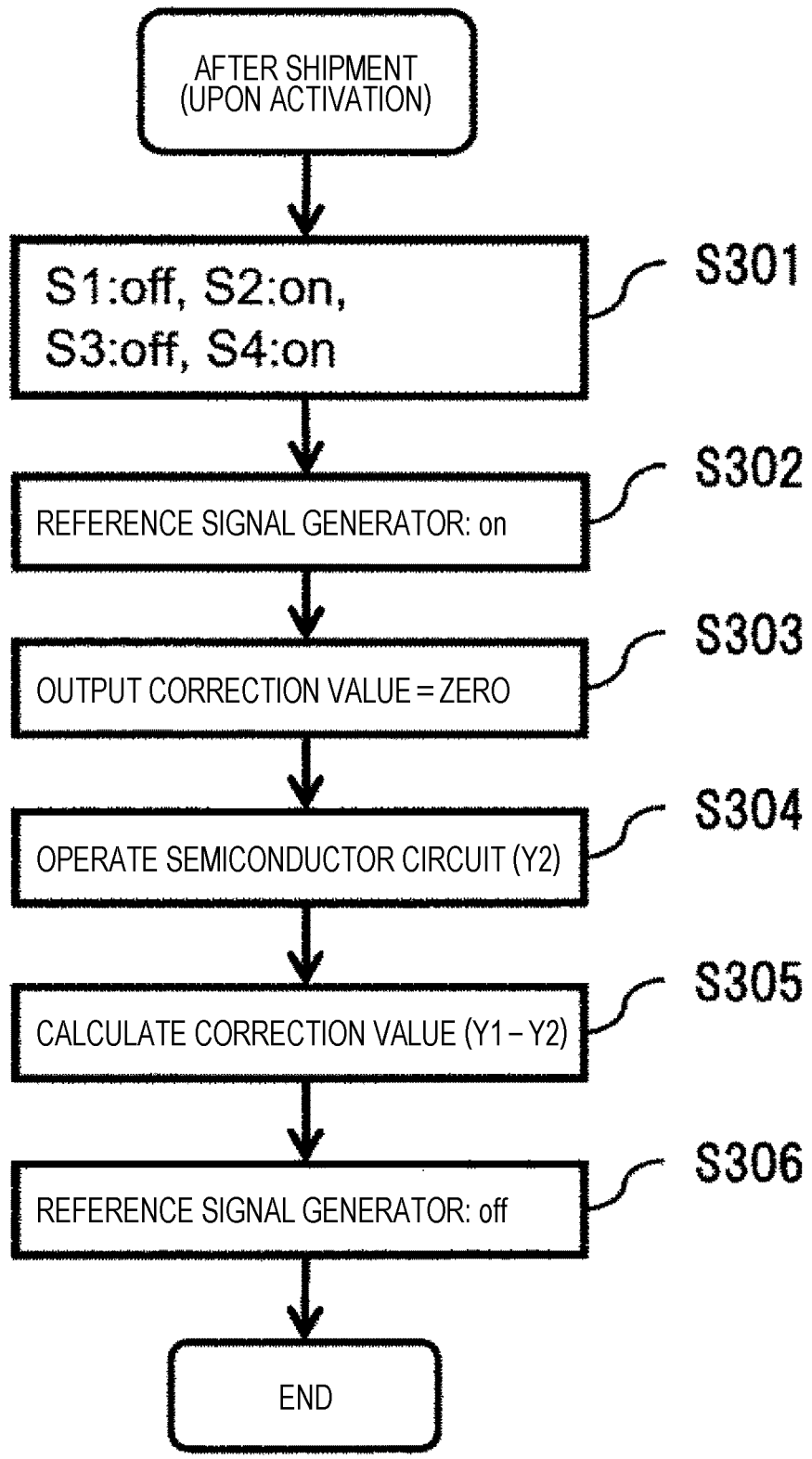
FIG. 3 is a flowchart illustrating operation of the semiconductor integrated device 1 after shipment.

FIG. 3 is a flowchart illustrating operation of the semiconductor integrated device 1 after shipment. The flowchart of FIG. 3 illustrates the process of determining a correction amount for an output value from the semiconductor circuit 400, and the steps of the flowchart are preferably performed, for example, upon activation of the semiconductor integrated device 1.

The semiconductor integrated device 1 turns off the switching circuit S1, turns on the switching circuit S2, turns off the write circuit S3, and turns on the write circuit S4 (S301). The semiconductor integrated device 1 activates the reference signal generator 200 (S302). The semiconductor integrated device 1 sets an output 701 from the correction-value storage circuit 700 to zero (S303). When the semiconductor circuit 400 is operated in this condition, the semiconductor circuit 400 outputs an output value Y2 according to the reference signal 201 from the reference signal generator 200 (S304). The difference operation circuit 600 calculates a difference between Y2 and an output 501 representing a value stored in the initial value storage circuit 500 at a time point before shipment, and stores an output 601 representing a result of the calculation in the correction-value storage circuit 700 (S305). The semiconductor integrated device 1 turns off the reference signal generator 200 (S306).

In the flowchart of FIG. 3, a variation of the semiconductor circuit 400 over time caused by operation of the semiconductor integrated device 1 after shipment can be obtained for an initial value Y1 determined before shipment. The variation can be used as a correction value to correct the characteristic variation of the semiconductor circuit 400 over time. The correction value can be calculated, for example, on the basis of the following formula (A1):

$$\text{correction value} = Y1 - Y2 \tag{A1}$$

Figure 4:
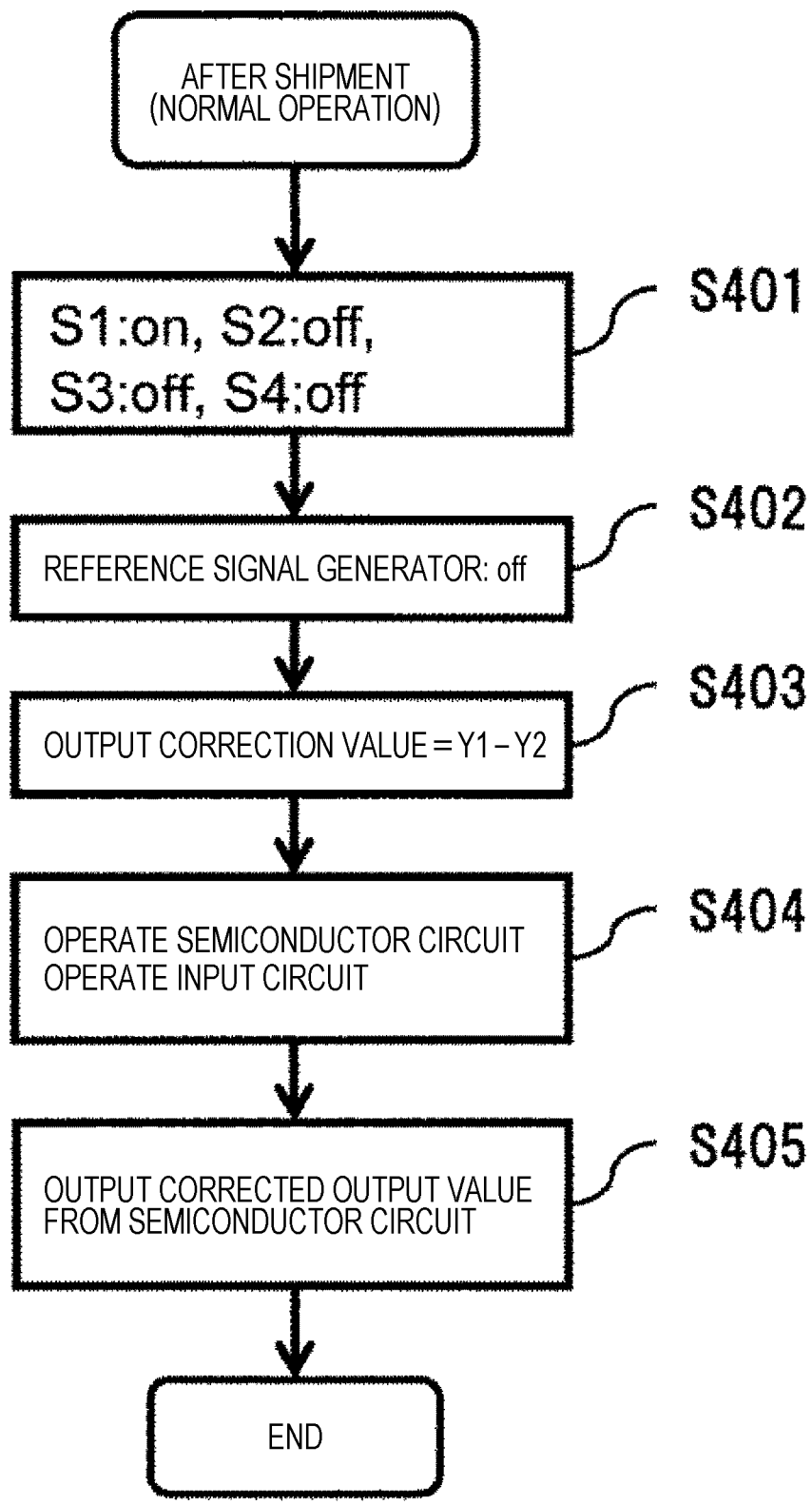
FIG. 4 is a flowchart illustrating operation of the semiconductor integrated device 1 after shipment.

FIG. 4 is a flowchart illustrating operation of the semiconductor integrated device 1 after shipment. The flowchart of FIG. 4 illustrates the steps of correcting a characteristic variation of the semiconductor circuit 400 over time during normal operation of the semiconductor integrated device 1.

The semiconductor integrated device 1 turns on the switching circuit S1, turns off the switching circuit S2, turns off the write circuit S3, and turns off the write circuit S4 (S401). The semiconductor integrated device 1 turns off the reference signal generator 200 (S402). The correction-value storage circuit 700 outputs the correction value stored in the flowchart of FIG. 3 (S403). The semiconductor integrated device 1 operates the input circuit 100 and the semiconductor circuit 400 (S404). The correction circuit 800 applies the correction value output from the correction-value storage circuit 700 to an output 403 from the semiconductor circuit 400 to correct the variation of the output 403 from the semiconductor circuit 400 over time and generate an output 801 after correction (S405).

In addition to the variation of the semiconductor circuit 400 over time, the age deterioration of the reference signal generator 200, the initial value storage circuit 500, the difference operation circuit 600, the write circuit S3, and the write circuit S4 can be also prevented. For example, in a normal operation state, stopping the operation of these circuits prevents the age deterioration of these circuits, thus enabling appropriate correction amount detection according to the flowchart of FIG. 3. Hereinafter, a specific process will be described.

It is known that a threshold voltage of a semiconductor device, such as a metal oxide semiconductor (MOS) transistor, varies with time while a voltage is applied to the gate terminal. When a supply voltage to the reference signal generator 200 is shut off, a gate voltage of a MOS device of the reference signal generator 200 is reduced to zero, thus preventing the variation thereof over time. Alternatively, an appropriate switch can be used to change the gate voltage to zero without shutting off the supply voltage, thus obtaining the same effects.

It is known that a semiconductor device (e.g., MOS transistor) of the reference signal generator 200 exposed to high temperature varies with time at an accelerating rate. Therefore, a heat insulating portion can be provided between the reference signal generator 200 and heat generating portions to prevent age deterioration. Here, a representative example of a heat generating portion includes a microcontroller performing control calculation. When the reference signal generator 200 is separated as much as possible from these heat generating portions, air between the circuits functions as the heat insulating portion. Alternately, between the reference signal generator 200 and the heat generating portions, another heat-resistant member (structural member, another electrical component having characteristics hardly deteriorated by heat, or the like) may be arranged to be functioned as the heat insulating portion.

First Embodiment: Effects

As described above, according to the semiconductor integrated device 1 according to the present first embodiment, even when the characteristics of the semiconductor circuit 400 vary with time, the output 801 having the characteristics equal to those in an initial state upon shipment of the semiconductor integrated device 1 can be generated. Accordingly, the semiconductor integrated device 1 can maintain initial performance upon shipment.

Second Embodiment

Figure 5:
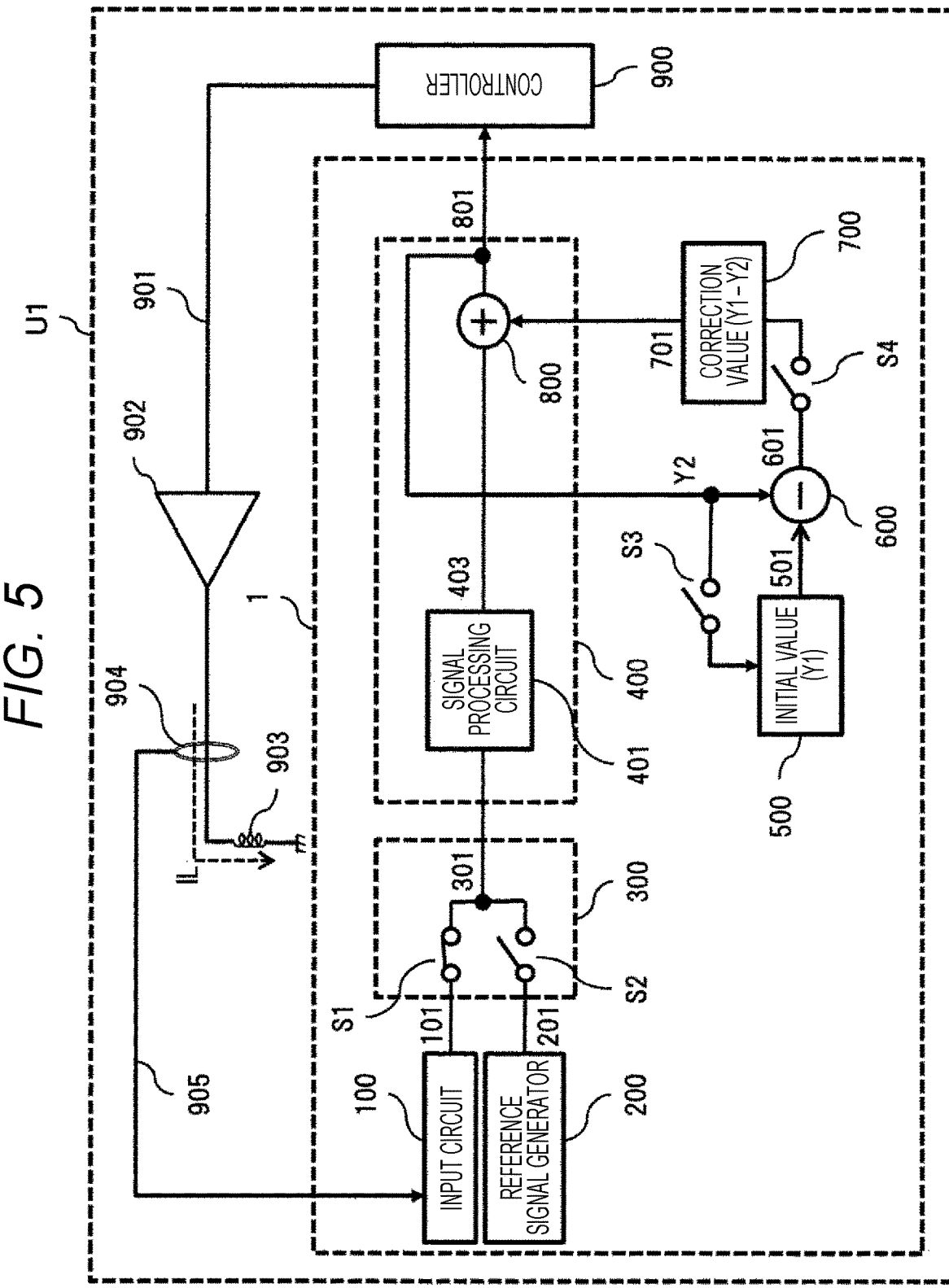
FIG. 5 is a block diagram illustrating a configuration of a vehicle-mounted control device U1 according to a second embodiment.

FIG. 5 is a block diagram illustrating a configuration of a vehicle-mounted control device U1 according to a second embodiment of the present invention. The vehicle-mounted control device U1 includes the semiconductor integrated device 1 described in the first embodiment, a controller 900, an electromagnetic load drive circuit 902, an electromagnetic load 903, and a load current monitoring circuit 904.

The controller 900 includes a calculation control device, such as a microcontroller, and outputs a control signal 901 for controlling the electromagnetic load drive circuit 902 in accordance with the output 801 from the semiconductor integrated device 1. The electromagnetic load drive circuit 902 drives the electromagnetic load 903 in accordance with the control signal 901. The electromagnetic load 903 is a load circuit, such as a solenoid, used for control of vehicle operation. The load current monitoring circuit 904 monitors the load current IL running through the electromagnetic load 903, and outputs a result of the monitoring as a monitor signal 905 to the input circuit 100 of the semiconductor integrated device 1.

The semiconductor circuit 400 performs processing, such as conversion of the monitor signal 905 received by the input circuit 100 to, for example, a digital signal, and outputs the digital signal to the controller 900. The controller 900 monitors the load current IL on the basis of the output 801 from the semiconductor circuit 400, and outputs the control signal 901 in accordance with the load current IL. Therefore, the load current IL flowing through the electromagnetic load 903 can be controlled highly accurately.

Figure 6:
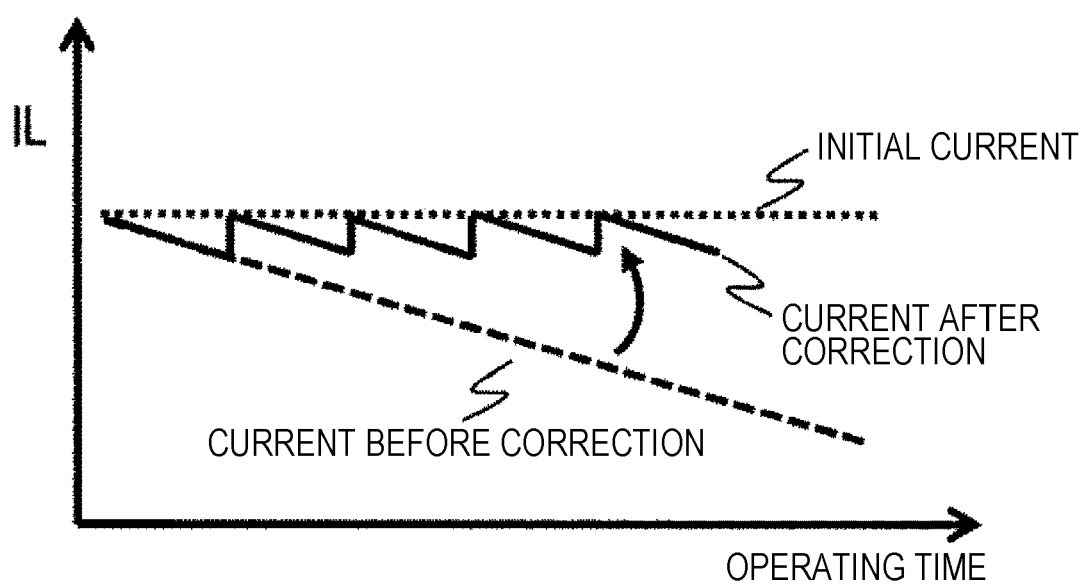
FIG. 6 is a graph illustrating an example of a change in load current IL over time.

FIG. 6 is a graph illustrating an example of a change in load current IL over time. The semiconductor circuit 400 sometimes generates an output 801 (current before correction in FIG. 6) having characteristics changed due to, for example, a variation over time with the passage of operating time, and thereby representing a value different from the monitor signal 905 received by the input circuit 100. Then, the controller 900 outputs a control signal 901 on the basis of a value different from the actual load current IL.

The output 403 from the semiconductor circuit 400 is corrected (current after correction in FIG. 6) by using the configuration described in the first embodiment and thereby an output from the semiconductor integrated device 1 can be generated with accuracy equal to that set at the factory before shipment. Thus, an accuracy of a result of monitoring the load current IL being an output from the vehicle-mounted control device U1 can be maintained.

Operation of determining a correction value described in FIG. 3 is preferably performed, for example, upon activation of the vehicle-mounted control device U1, or performed by the controller 900 by controlling the semiconductor integrated device 1 to perform the steps of the flowchart of FIG. 3, if necessary.

Second Embodiment: Effects

As described above, according to the vehicle-mounted control device U1 according to the present second embodiment, even when the characteristics of the semiconductor circuit 400 vary with time, the output 801 can be obtained with accuracy equal to that set before shipment. Thus, the failure of the controller 900, wrong operation of a vehicle/vehicle-mounted device as a result of the failure, or the like can be prevented.

Third Embodiment

Figure 7:
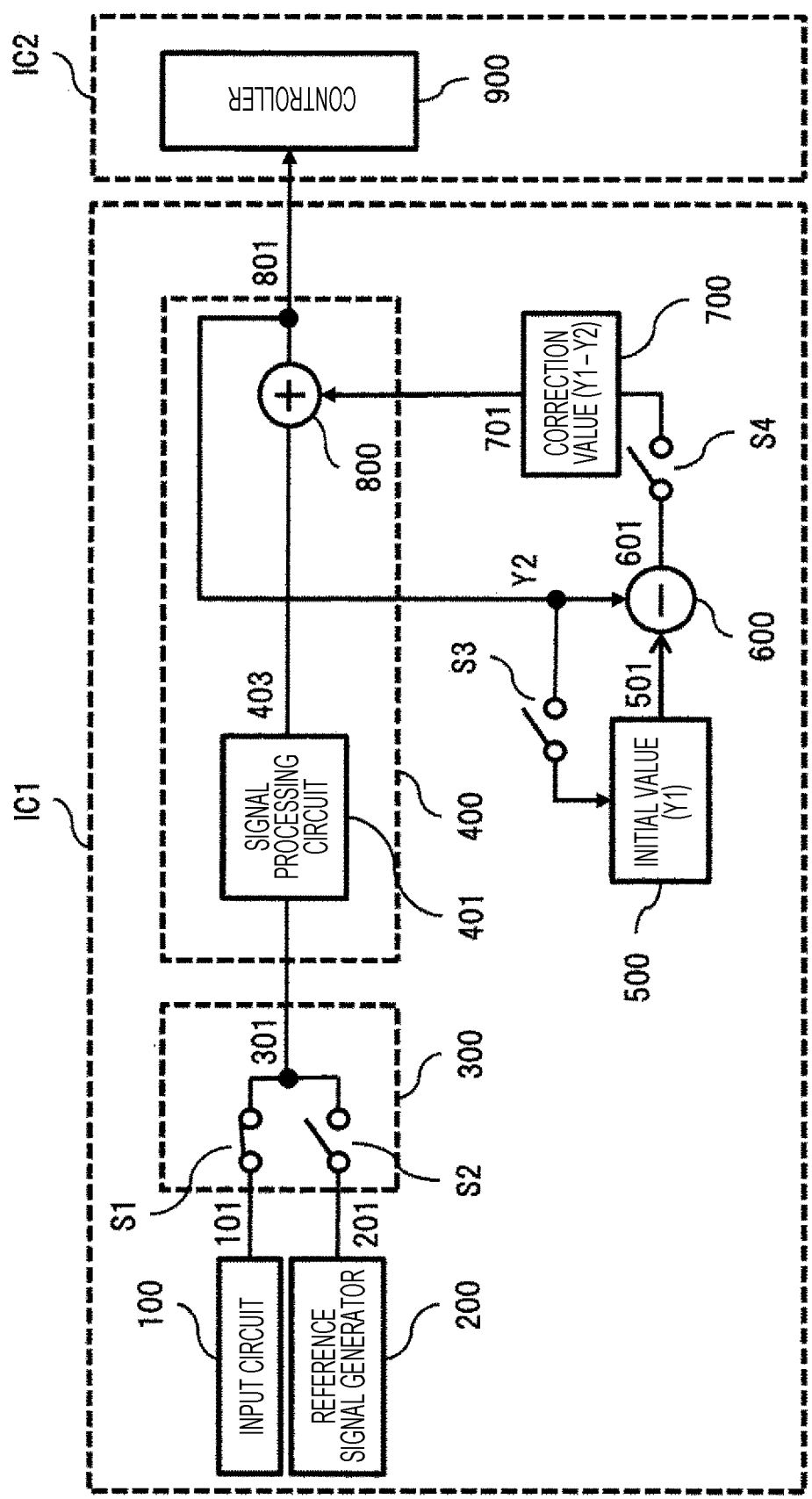
FIG. 7 is a block diagram illustrating a configuration of a vehicle-mounted control device according to a third embodiment.

FIG. 7 is a block diagram illustrating a configuration of a vehicle-mounted control device according to a third embodiment of the present invention. The vehicle-mounted control device illustrated in FIG. 7 includes a detection circuit IC (integrated circuit) 1 and a controller IC2. The detection circuit IC1 includes the semiconductor integrated device 1, which has been described in the first embodiment. The controller IC2 includes the controller 900, which has been described in the second embodiment. These circuits are put together in the respective ICs, and thus the number of signal lines of the vehicle-mounted control device can be reduced to reduce the size of the device.

Fourth Embodiment

Figure 8:
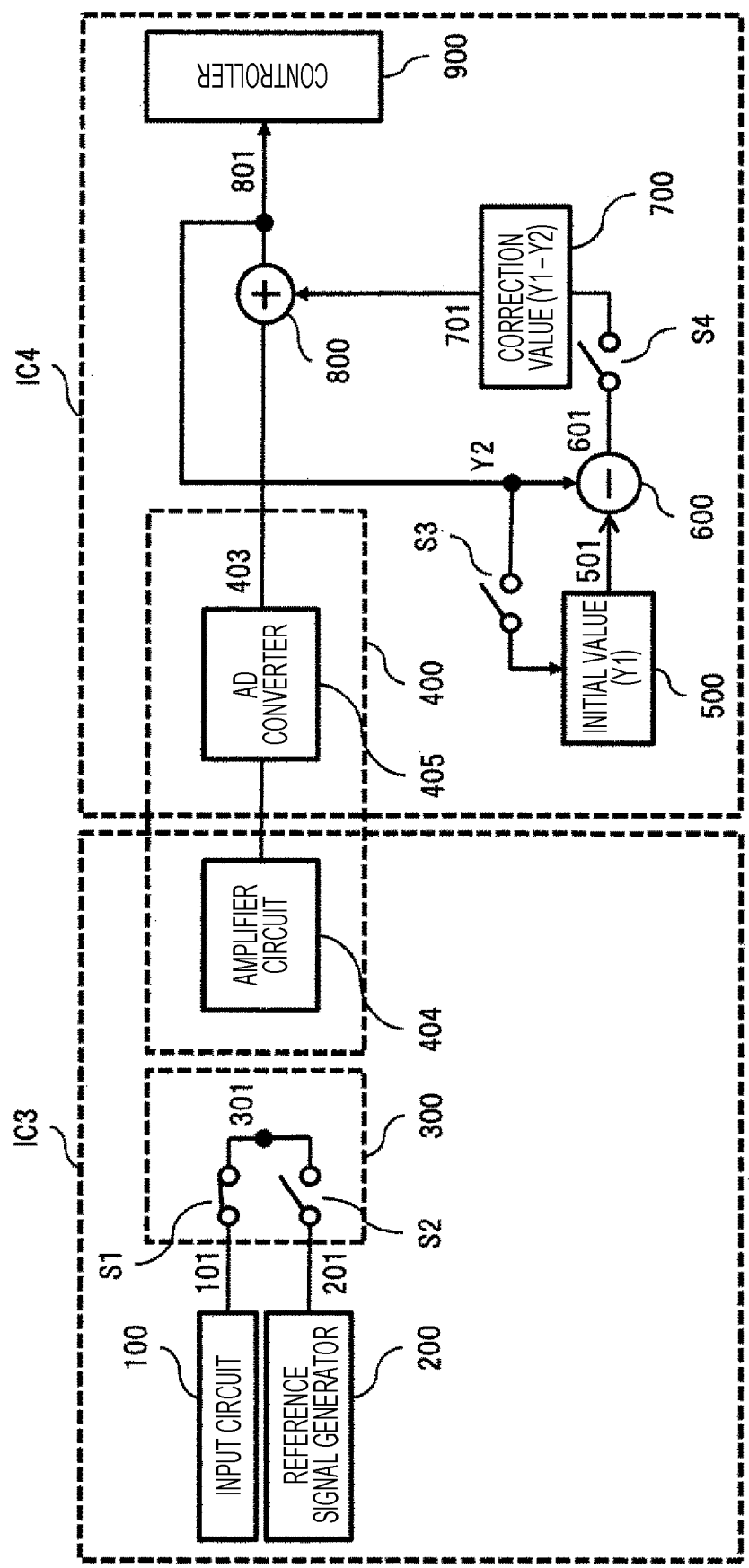
FIG. 8 is a block diagram illustrating a configuration of a vehicle-mounted control device according to a fourth embodiment.

FIG. 8 is a block diagram illustrating a configuration of a vehicle-mounted control device according to a fourth embodiment of the present invention. The vehicle-mounted control device illustrated in FIG. 8 includes a detection circuit IC3 and a controller IC4. The detection circuit IC3 includes the input circuit 100, the reference signal generator 200, the input switching circuit 300, and part of the semiconductor circuit 400 (e.g., an amplifier circuit 404) of the configuration described in the first embodiment. The controller IC4 includes the rest of the semiconductor circuit 400 (e.g., an AD converter 405), the initial value storage circuit 500, the difference operation circuit 600, the correction-value storage circuit 700, the correction circuit 800, the write circuit S3, the write circuit S4, and further includes the controller 900 described in the second embodiment. The vehicle-mounted control device according to the present fourth embodiment can provide effects similar to those of the first to third embodiments.

Fifth Embodiment

Figure 9:
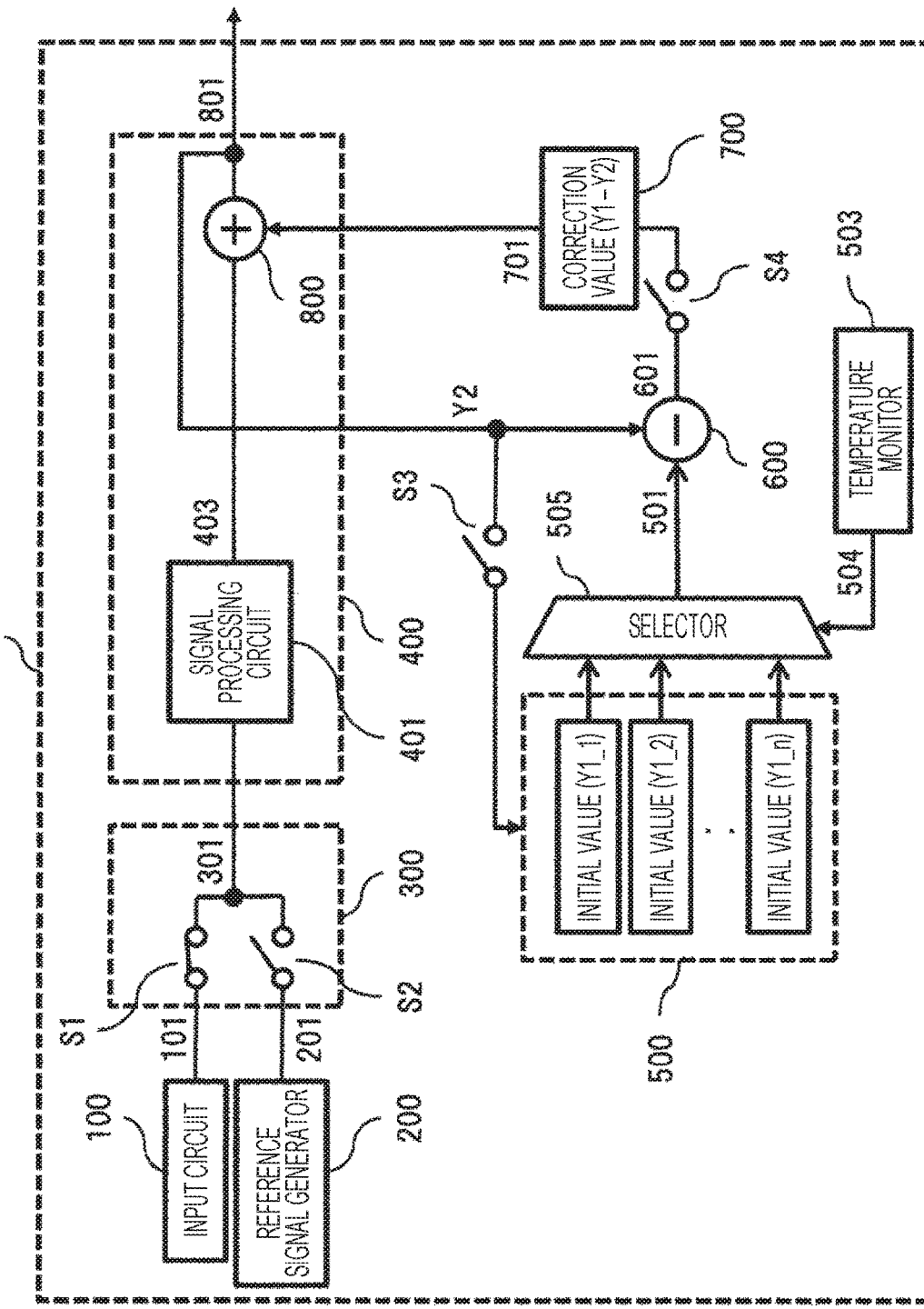
FIG. 9 is a block diagram illustrating a configuration of a semiconductor integrated device 1 according to a fifth embodiment.

FIG. 9 is a block diagram illustrating a configuration of a semiconductor integrated device 1 according to a fifth embodiment of the present invention. The semiconductor integrated device 1 according to the present fifth embodiment includes a temperature monitor circuit 503 and a selector circuit 505, in addition to the configuration described in the first embodiment. Furthermore, the initial value storage circuit 500 stores a plurality of initial values (Y1_1 to Y1_n). The other configurations are basically similar to those of the first embodiment, and thus different points will be mainly described below.

The temperature monitor circuit 503 measures the temperature of the semiconductor integrated device 1 (in particular, the temperature of the semiconductor circuit 400), and outputs a result of the measurement as an output 504. The selector circuit 505 selects an initial value corresponding to the output 504 from the temperature monitor circuit 503, from a plurality of initial values stored in the initial value storage circuit 500, and generates the selected initial value as the output 501.

Figure 10:
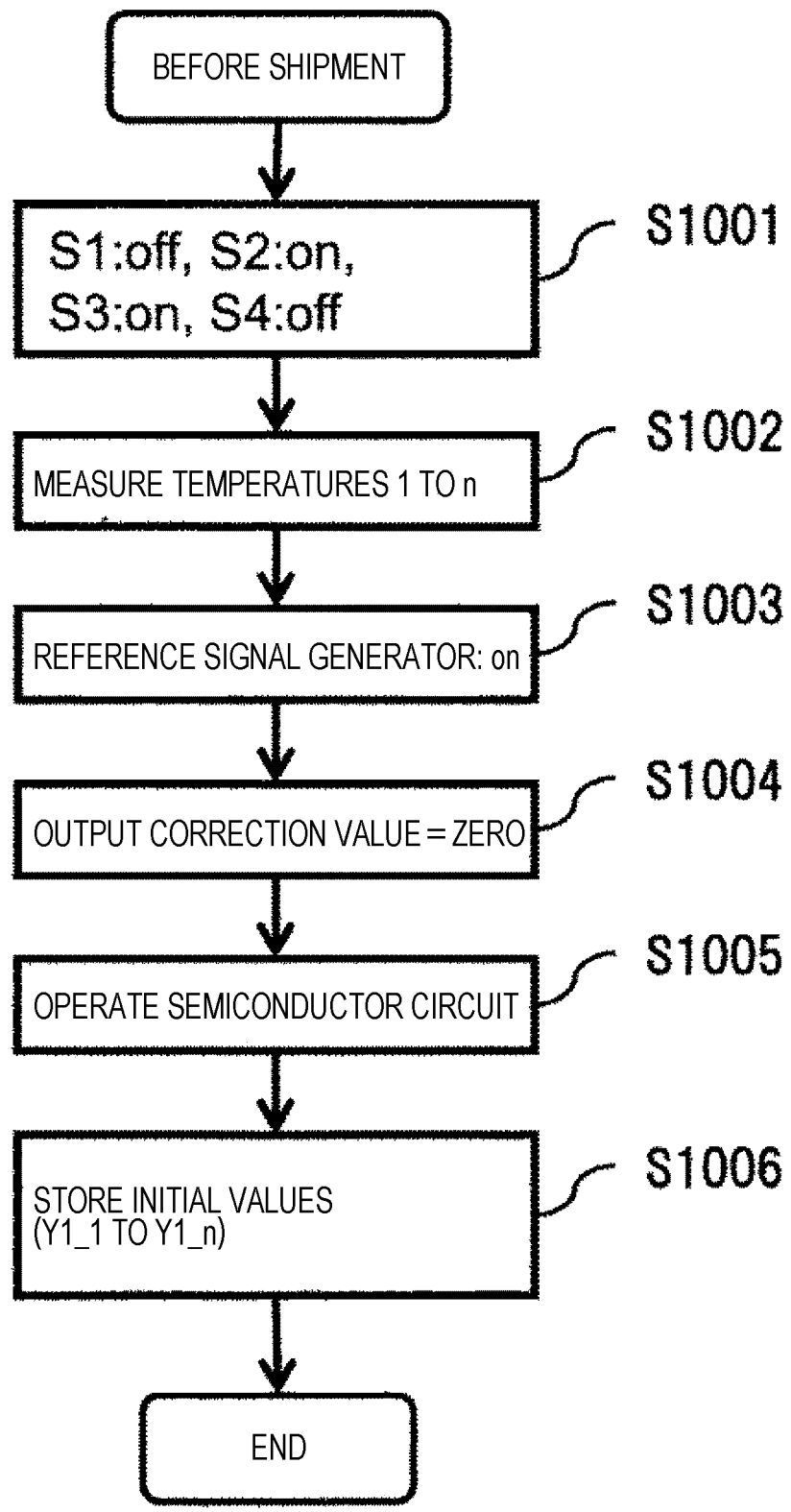
FIG. 10 is a flowchart illustrating operation of the semiconductor integrated device 1 before shipment.

FIG. 10 is a flowchart illustrating operation of the semiconductor integrated device 1 before shipment. In step S1002, the temperature of the semiconductor integrated device 1 is measured more than once, and an initial value corresponding to each measurement is stored in the initial value storage circuit 500, in step S1006. The other steps are similar to the steps of FIG. 2. For preparation of diverse initial values, it is desirable to store initial values which are acquired in temperature conditions within as wide operation temperature range as possible of, for example, the semiconductor integrated device 1 (in particular, the semiconductor circuit 400). The initial value storage circuit 500 can store a pair of each initial value and a measurement result of the initial value from the temperature monitor circuit 503.

Figure 11:
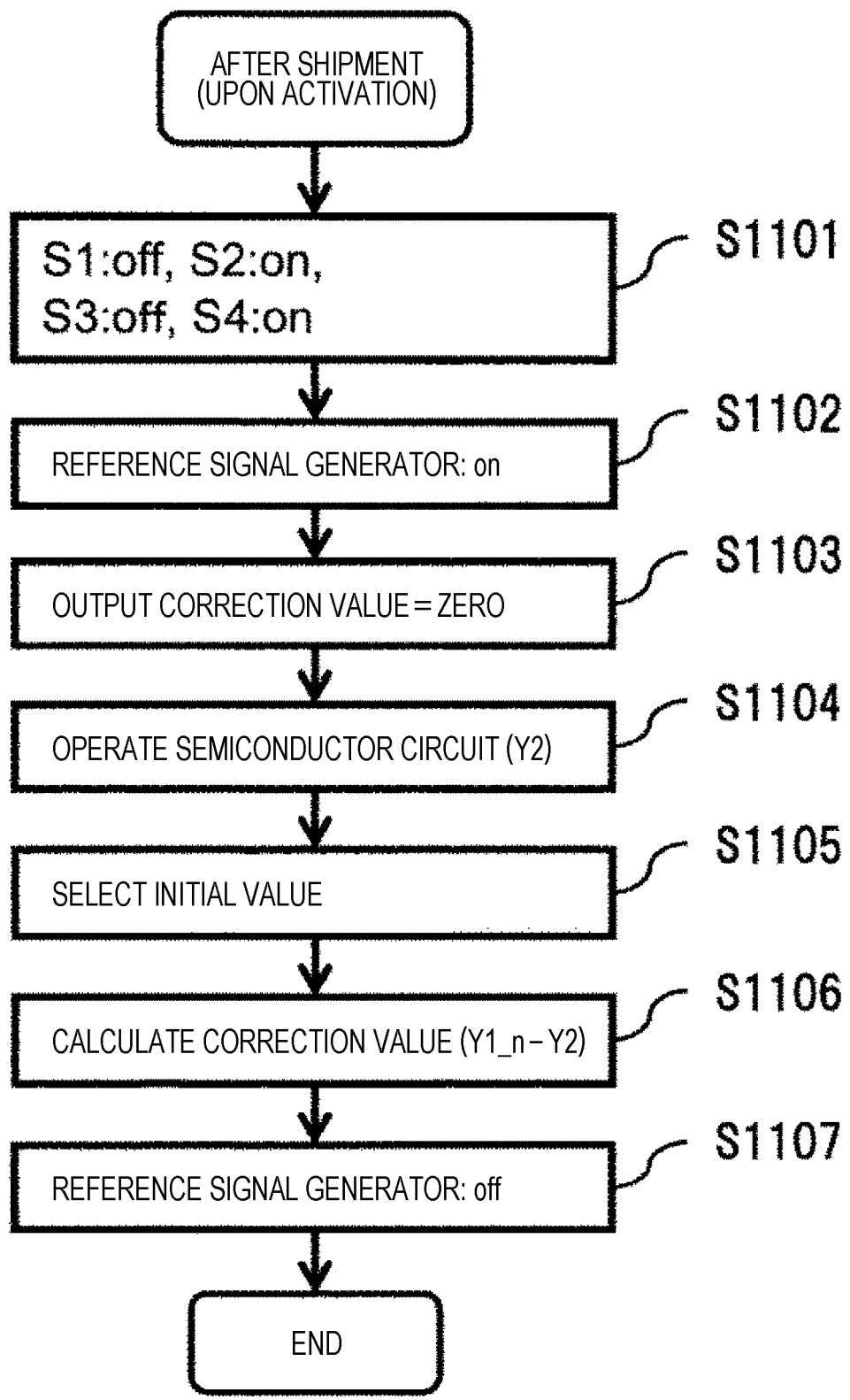
FIG. 11 is a flowchart illustrating operation of the semiconductor integrated device 1 after shipment.

FIG. 11 is a flowchart illustrating operation of the semiconductor integrated device 1 after shipment. In step S1105, the selector circuit 505 acquires a measurement result from the temperature monitor circuit 503, and selects an initial value corresponding to the measurement result. In step S1106, the difference operation circuit 600 calculates a difference between the initial value selected by the selector circuit 505 and Y2. The other steps are similar to the steps of FIG. 3.

Figure 12:
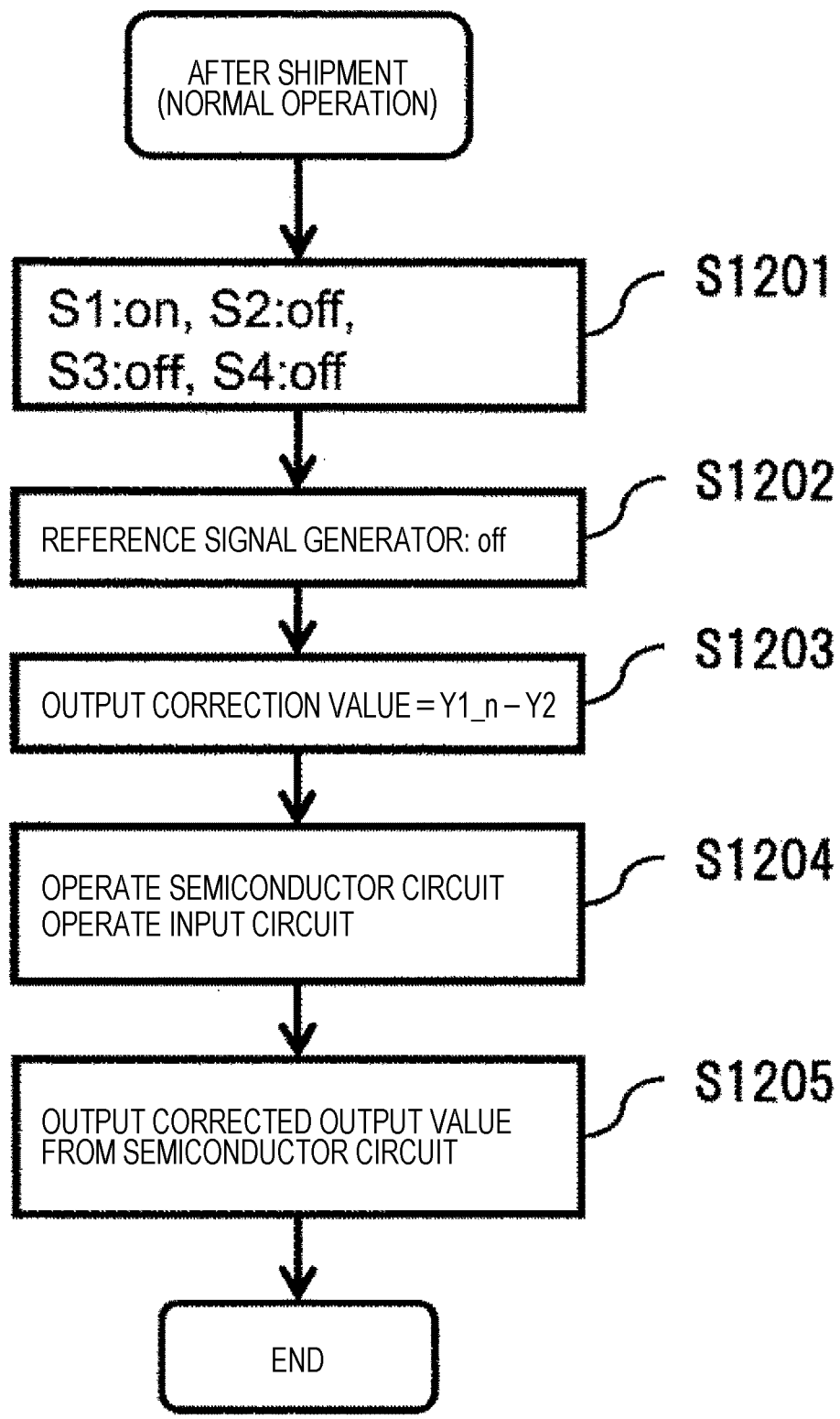
FIG. 12 is a flowchart illustrating operation of the semiconductor integrated device 1 after shipment.

FIG. 12 is a flowchart illustrating operation of the semiconductor integrated device 1 after shipment. In step S1203, the correction-value storage circuit 700 outputs a correction value corresponding to the initial value selected by the selector circuit 505 (corresponding to the measurement result from the temperature monitor circuit 503). The other steps are similar to the steps of FIG. 4.

Fifth Embodiment: Effects

As described above, the semiconductor integrated device 1 according to the present fifth embodiment uses a correction value corresponding to a temperature upon operation to correct an output from the semiconductor circuit 400. Thus, a temperature dependence of a characteristic variation can be corrected.

Sixth Embodiment

Figure 13:
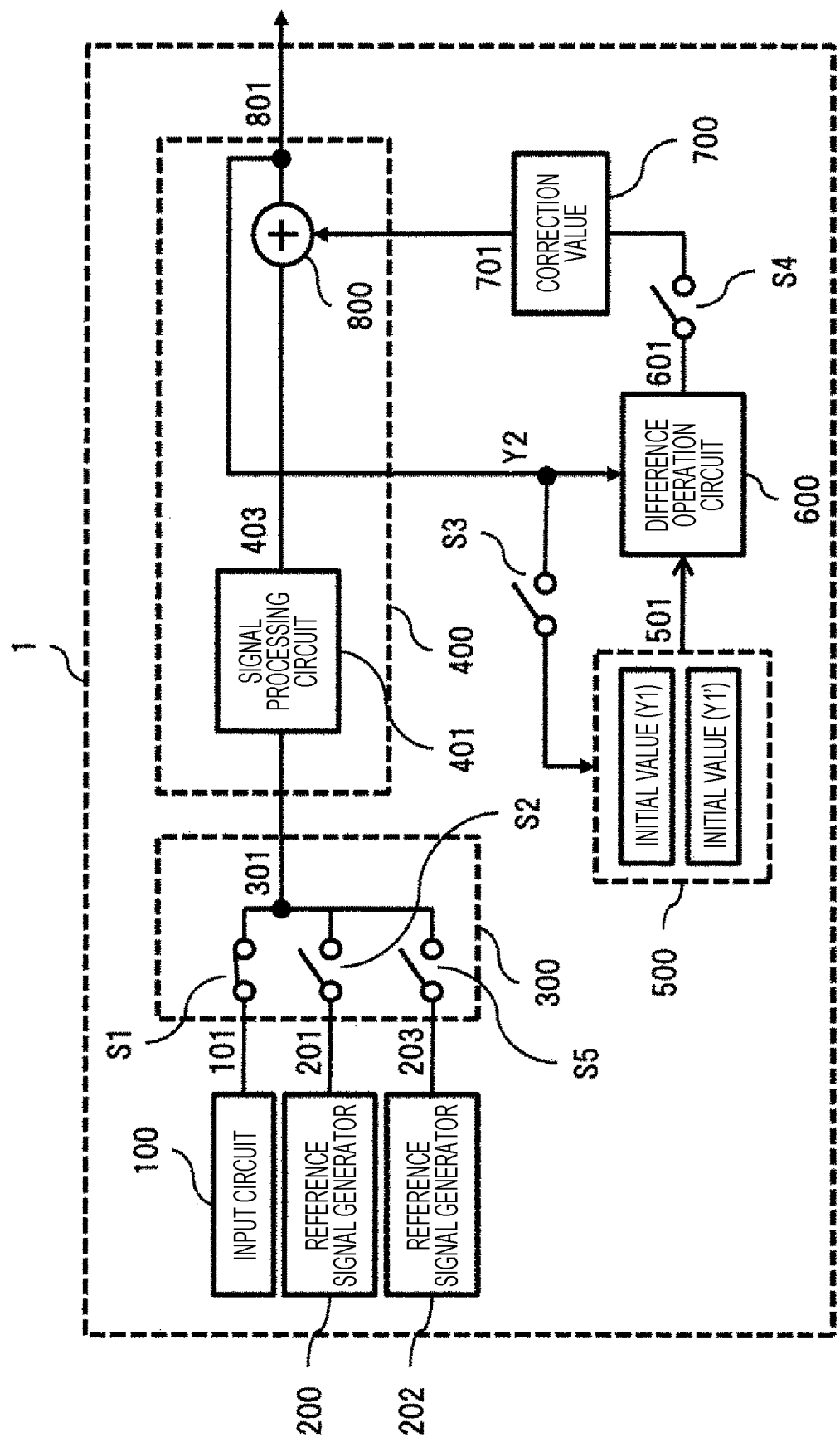
FIG. 13 is a block diagram illustrating a configuration of a semiconductor integrated device 1 according to a sixth embodiment.

FIG. 13 is a block diagram illustrating a configuration of a semiconductor integrated device 1 according to a sixth embodiment of the present invention. The semiconductor integrated device 1 according to the present sixth embodiment includes a second reference signal generator 202, in addition to the configuration described in the first embodiment. The second reference signal generator 202 outputs a second reference signal 203 having a signal level different from that of the reference signal generator 200. The input switching circuit 300 includes a switching circuit S5 in addition to the configuration described in the first embodiment. The initial value storage circuit 500 can store two initial values (Y1 and Y1'). The difference operation circuit 600 determines a correction value relating to the above configuration, which is described later. The other configurations are basically similar to those of the first embodiment, and thus different points will be mainly described below.

Figure 14:
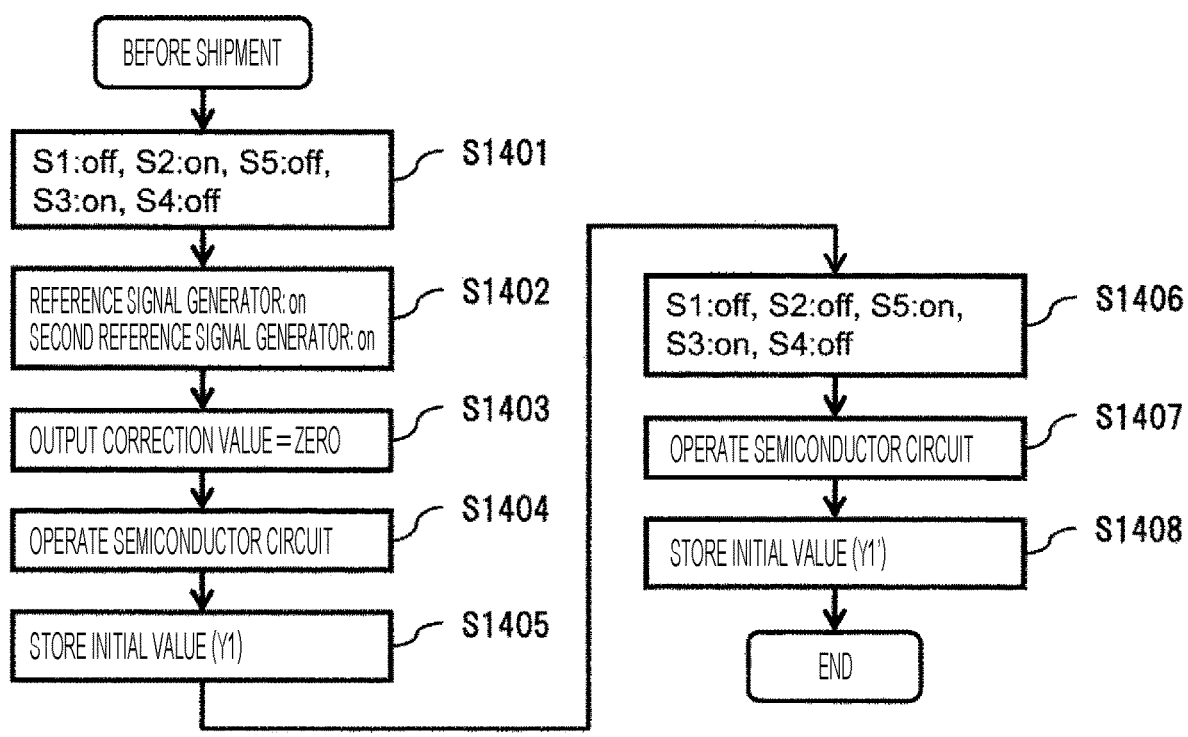
FIG. 14 is a flowchart illustrating operation of the semiconductor integrated device 1 before shipment.

FIG. 14 is a flowchart illustrating operation of the semiconductor integrated device 1 before shipment. In step S1401, the input switching circuit 300 turns on only the switching circuit S2 corresponding to the reference signal generator 200. In step S1402, the reference signal generator 200 and the second reference signal generator 202 are operated. Thereby, the initial value storage circuit 500 stores the initial value Y1 corresponding to the reference signal 201. In step S1406, the input switching circuit 300 turns on only the switching circuit S5 corresponding to the second reference signal generator 202. When the semiconductor circuit 400 is operated in this condition (S1407), the initial value storage circuit 500 stores an initial value Y1' corresponding to the second reference signal 203.

From the viewpoint of correction value calculation, which is described later, it is desirable that the reference signal generator 200 outputs the reference signal 201 which corresponds to a maximum value within an input range of the semiconductor circuit 400, and the second reference signal generator 202 outputs the second reference signal 203 which corresponds to a minimum value within the input range of the semiconductor circuit 400.

Figure 15:
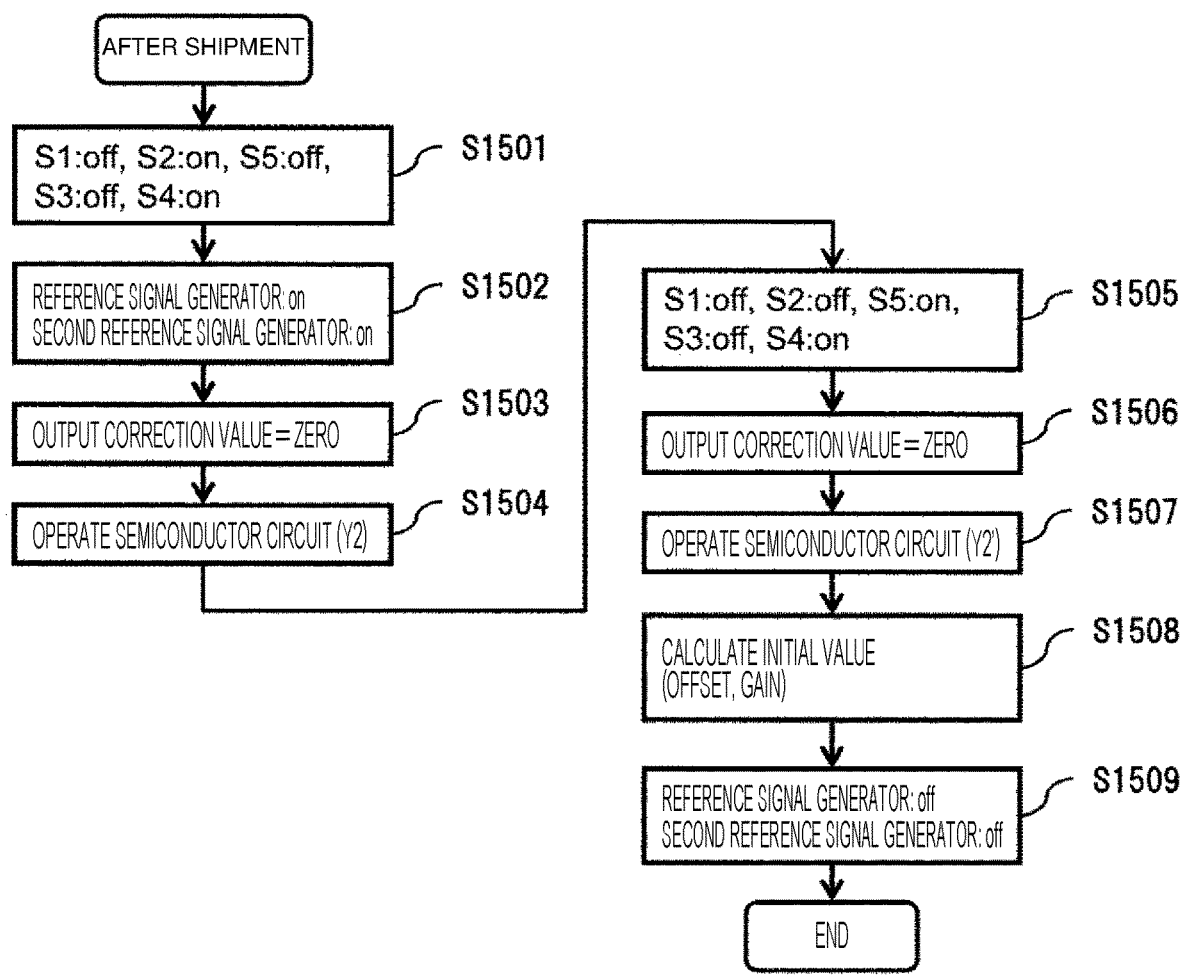
FIG. 15 is a flowchart illustrating operation of the semiconductor integrated device 1 after shipment.

FIG. 15 is a flowchart illustrating operation of the semiconductor integrated device 1 after shipment. In step S1501 to S1504, the semiconductor integrated device 1 acquires the output value Y2 from the semiconductor circuit 400 corresponding to the reference signal 201. In step S1505 to S1507, the semiconductor integrated device 1 similarly acquires an output value Y2' from the semiconductor circuit 400 corresponding to the second reference signal 203. In step S1508, the difference operation circuit 600 calculates an offset variation and a gain variation on the basis of the characteristic variation of the semiconductor circuit 400 over time, in accordance with the following formulas A2 and A3. The correction-value storage circuit 700 stores these offset variation and gain variation as correction values.

Offset variation=$Y1-Y2$ (A2)

Gain variation=$(Y2-Y2')/(Y1-Y1')$ (A3)

Figure 16:
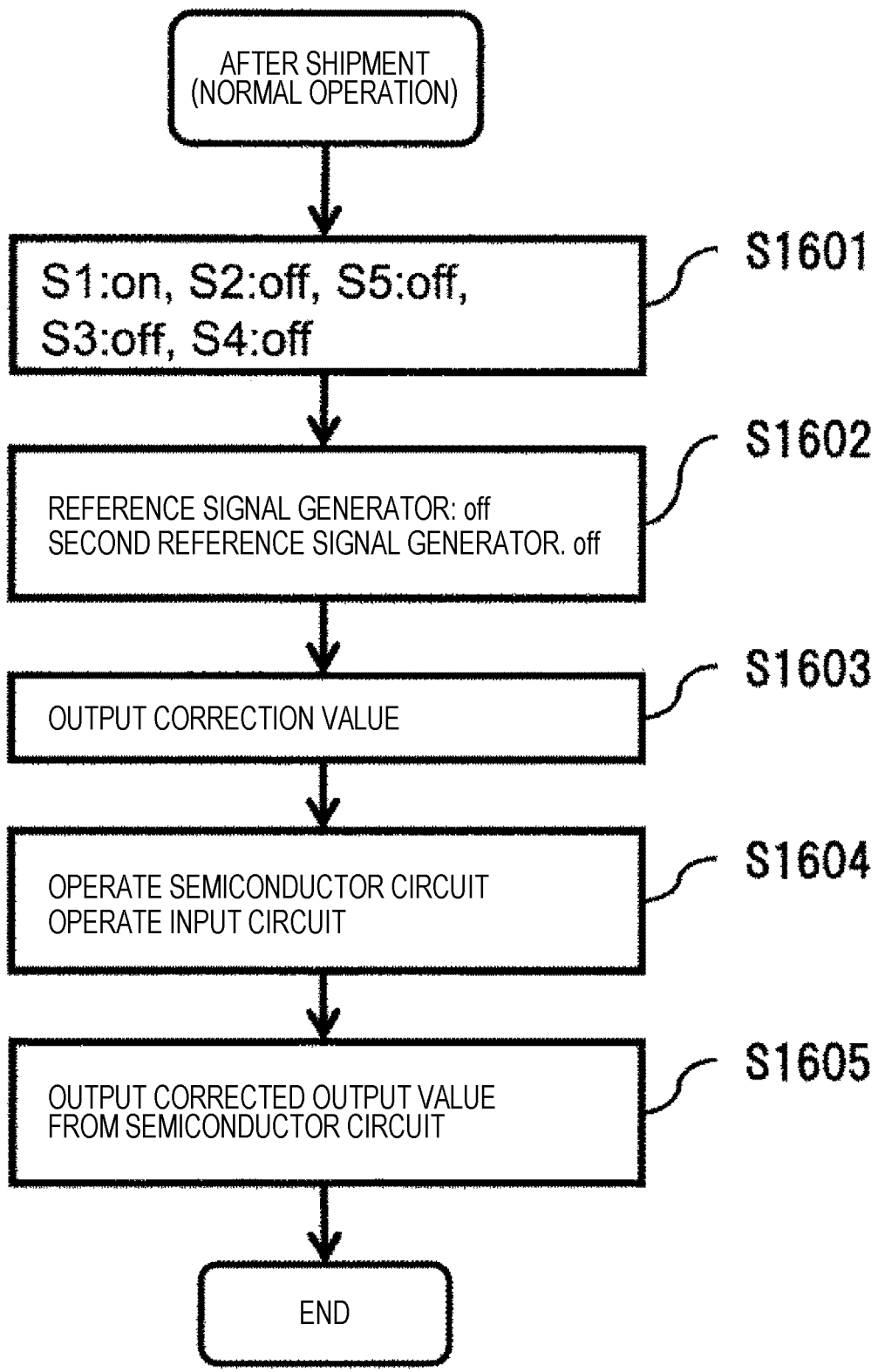
FIG. 16 is a flowchart illustrating operation of the semiconductor integrated device 1 after shipment.

FIG. 16 is a flowchart illustrating operation of the semiconductor integrated device 1 after shipment. In step S1603, the correction circuit 800 uses the offset variation and the gain variation stored in the correction-value storage circuit 700 to correct an offset and a gain of the semiconductor circuit 400. The other steps are similar to the steps of FIG. 4.

Seventh Embodiment

Figure 17:
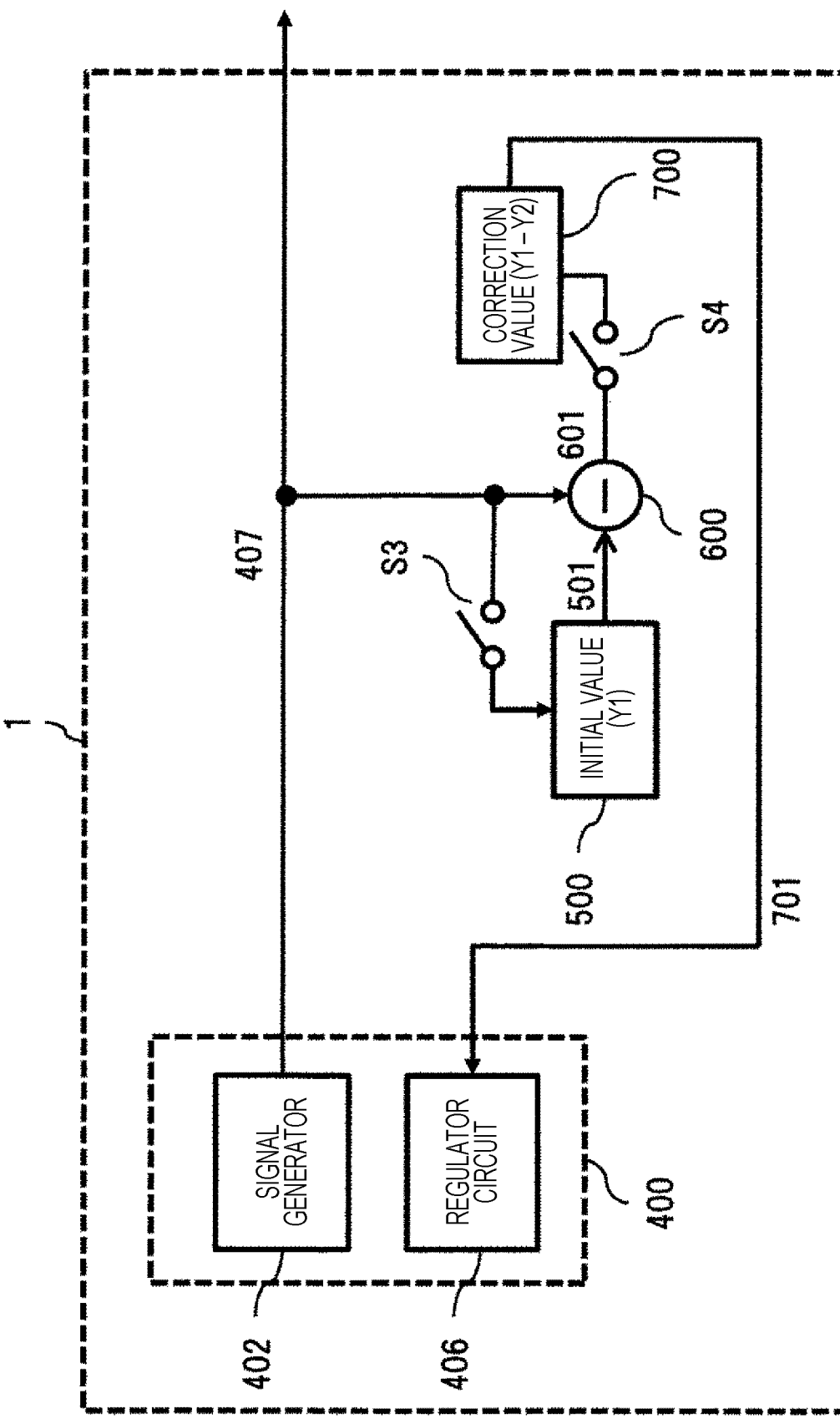
FIG. 17 is a block diagram illustrating a configuration of a semiconductor integrated device 1 according to a seventh embodiment.

FIG. 17 is a block diagram illustrating a configuration of a semiconductor integrated device 1 according to a seventh embodiment of the present invention. The semiconductor integrated device 1 according to the present seventh embodiment is a device for generating and outputting a signal by itself, and includes the semiconductor circuit 400, the initial value storage circuit 500, the difference operation circuit 600, the correction-value storage circuit 700, the write circuit S3, and the write circuit S4.

In the present seventh embodiment, the semiconductor circuit 400 includes a signal generator 402 for generating an output 407, and a regulator circuit 406 for regulating the output 407. The regulator circuit 406 corrects the output 407 from the signal generator 402, in accordance with the output 701 from the correction-value storage circuit 700, that is, a correction value. The functions of the initial value storage circuit 500, the difference operation circuit 600, the correction-value storage circuit 700, the write circuit S3, and the write circuit S4 are similar to those in the first embodiment.

Figure 18:
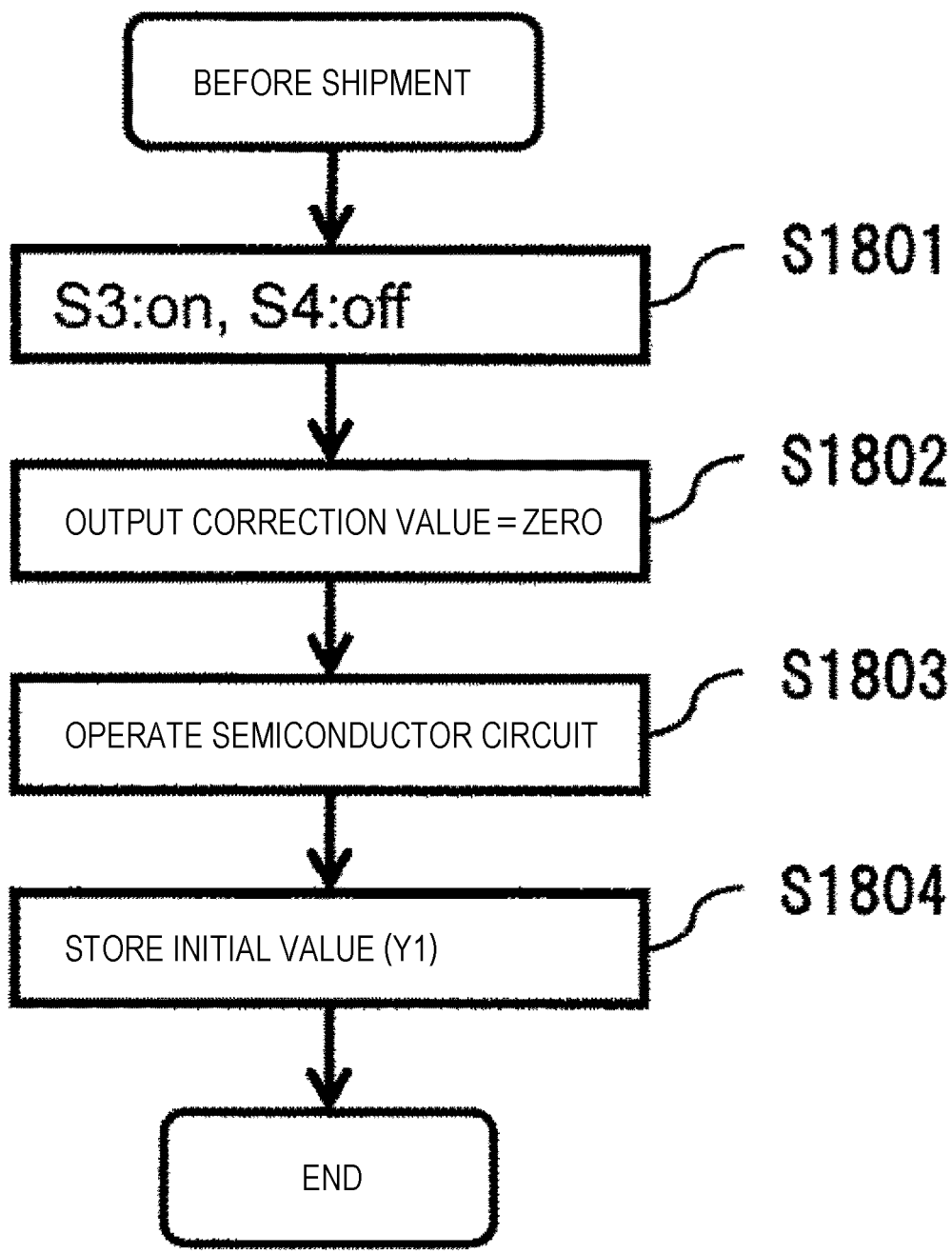
FIG. 18 is a flowchart illustrating operation of the semiconductor integrated device 1 before shipment.

FIG. 18 is a flowchart illustrating operation of the semiconductor integrated device 1 before shipment. Before shipment, the semiconductor integrated device 1 turns on the write circuit S3, and turns off the write circuit S4 (S1801). The semiconductor integrated device 1 sets the output 701 from the correction-value storage circuit 700 to zero (S1802). The regulator circuit 406 performs regulation corresponding to the correction value (e.g., no regulation). When the semiconductor circuit 400 is operated in this condition (S1803), the initial value storage circuit 500 stores a value corresponding to the output 407 from the signal generator 402 (S1804). The steps of the flowchart of FIG. 18 are preferably performed, for example, in a release test for the semiconductor integrated device 1, as in FIG. 2.

Figure 19:
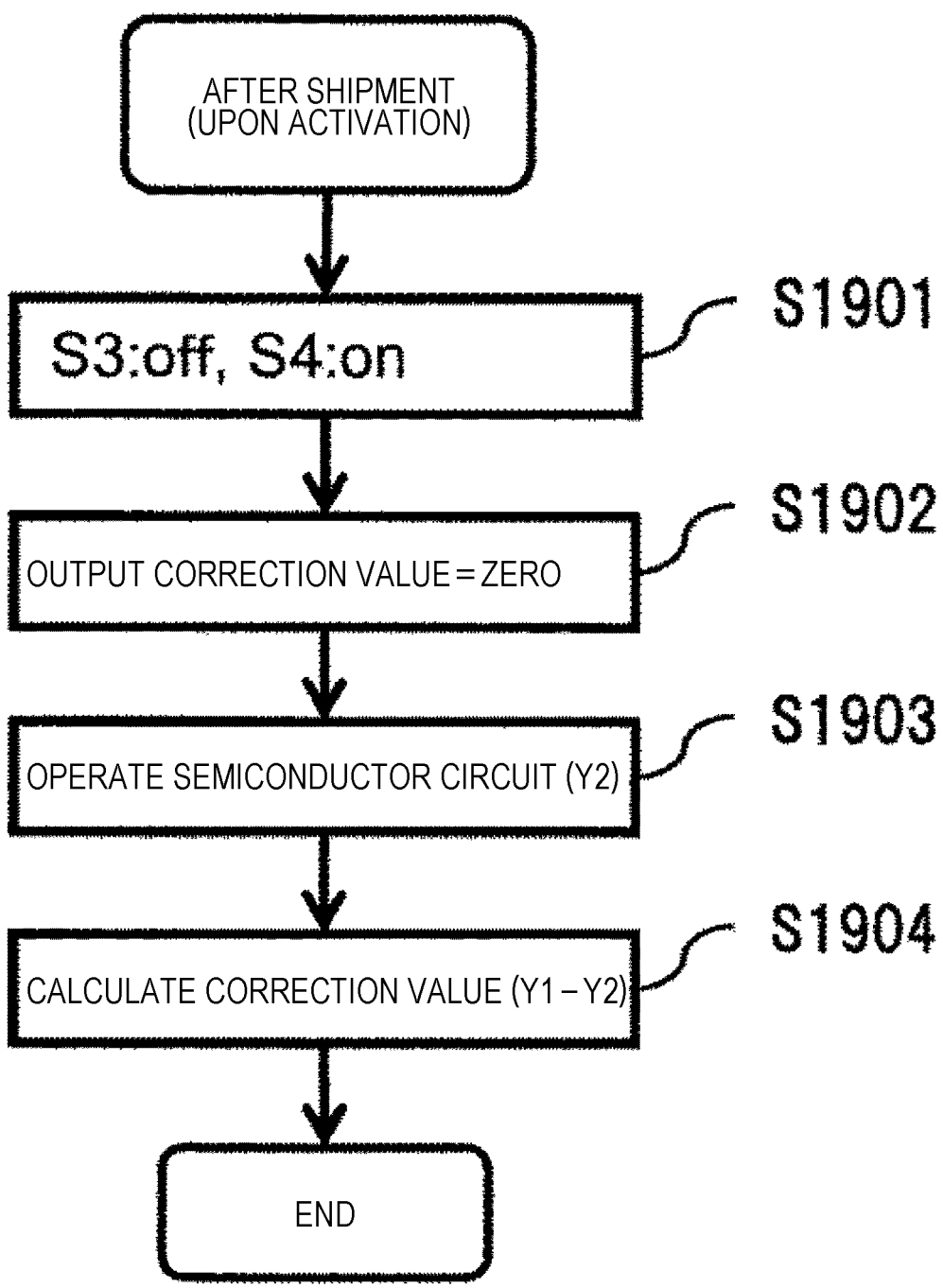
FIG. 19 is a flowchart illustrating operation of the semiconductor integrated device 1 after shipment.

FIG. 19 is a flowchart illustrating operation of the semiconductor integrated device 1 after shipment. The steps of the flowchart of FIG. 19 are preferably performed, for example, upon activation of the semiconductor integrated device 1, as in FIG. 3.

The semiconductor integrated device 1 turns off the write circuit S3, and turns on the write circuit S4 (S1901). The semiconductor integrated device 1 sets the output 701 from the correction-value storage circuit 700 to zero (S1902). When the semiconductor circuit 400 is operated in this condition, the semiconductor circuit 400 outputs the output value Y2 (S1903). The difference operation circuit 600 calculates a difference between Y2 and the output 501 representing a value stored in the initial value storage circuit 500 at a time point before shipment, and stores the output 601 representing a result of the calculation in the correction-value storage circuit 700 (S1904). In accordance with the flowchart of FIG. 19, a variation of the semiconductor circuit 400 over time caused by the operation of the semiconductor integrated device 1 after shipment can be obtained for the initial value Y1 determined before shipment.

Figure 20:
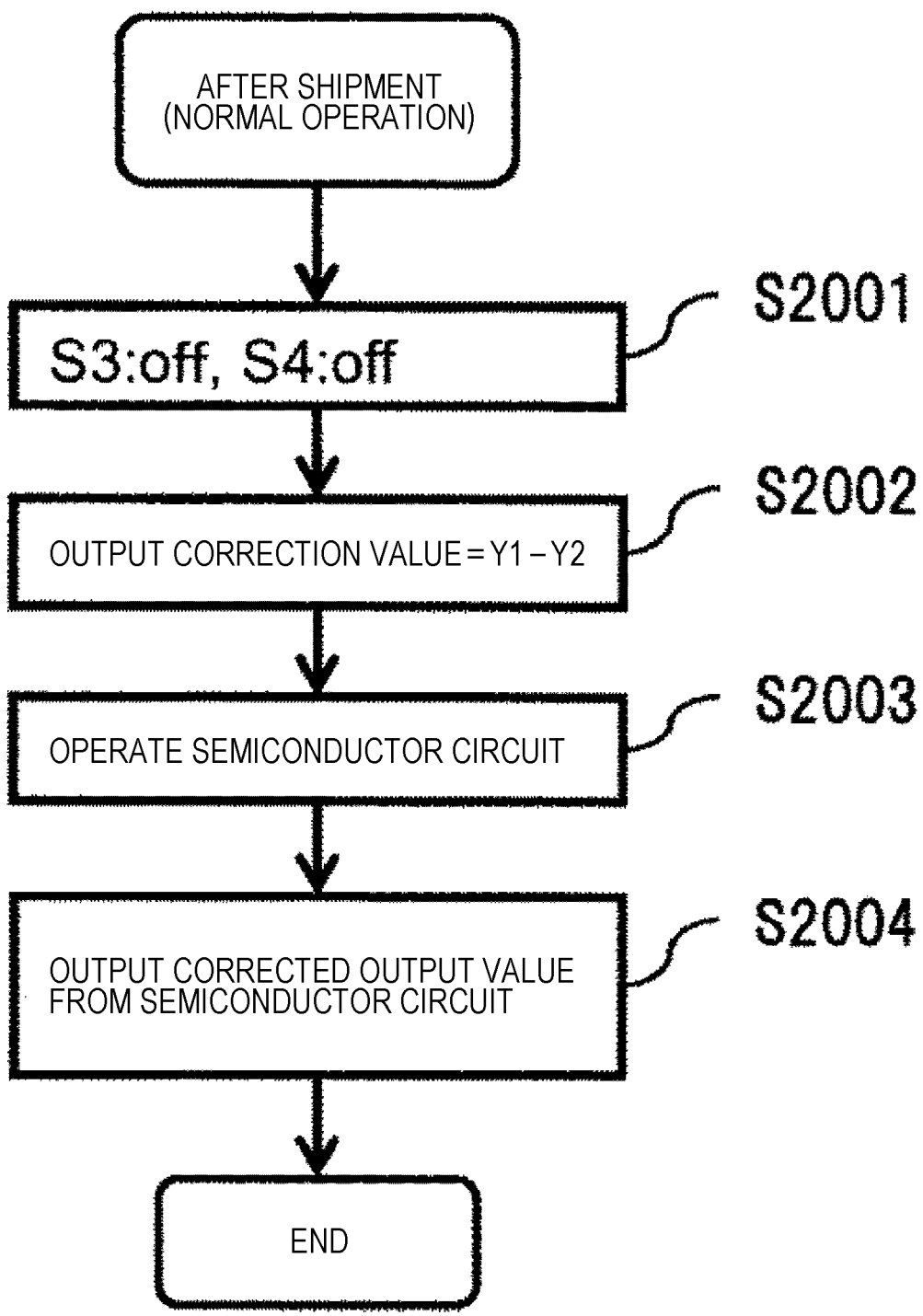
FIG. 20 is a flowchart illustrating operation of the semiconductor integrated device 1 after shipment.

FIG. 20 is a flowchart illustrating operation of the semiconductor integrated device 1 after shipment. The flowchart of FIG. 20 illustrates the steps of correcting a characteristic variation of the semiconductor circuit 400 over time during normal operation of the semiconductor integrated device 1, as in FIG. 4. The semiconductor integrated device 1 turns off the write circuit S3, and turns off the write circuit S4 (S2001). Step S2002 to S2004 are similar to steps S403 to S405.

Seventh Embodiment: Effects

As described above, even when the characteristics of the semiconductor circuit 400 and the correction-value storage circuit 700 vary with time, the semiconductor integrated device 1 according to the present seventh embodiment can maintain the characteristics of the output 407 upon shipment, as in the first embodiment. Furthermore, the operations of the initial value storage circuit 500, the difference operation circuit 600, the write circuit S3, and the write circuit S4 are stopped, and thereby the age deterioration of these circuits can be also prevented, as in the first embodiment.

Eighth Embodiment

Figure 21:
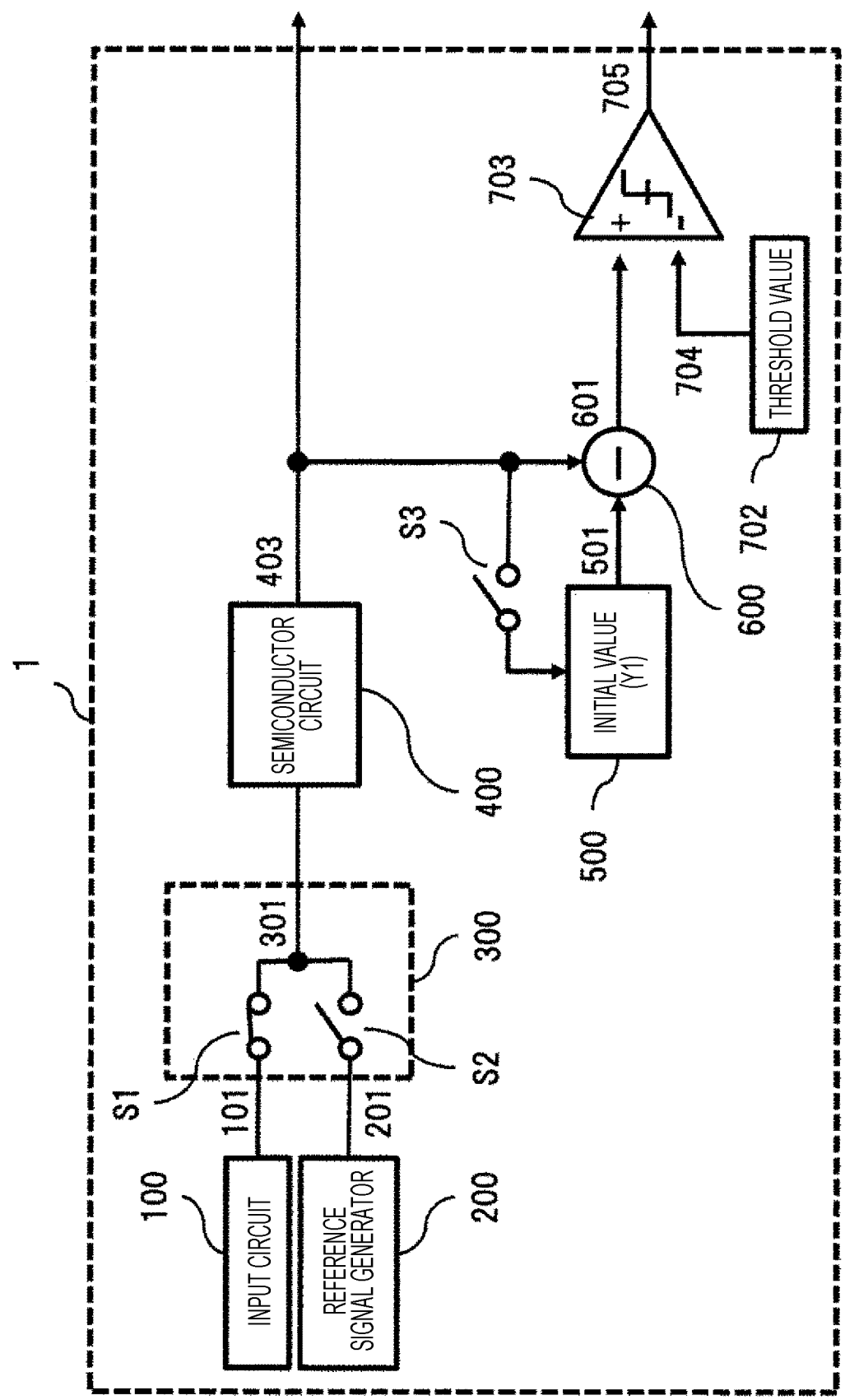
FIG. 21 is a block diagram illustrating a configuration of a semiconductor integrated device 1 according to an eighth embodiment.

FIG. 21 is a block diagram illustrating a configuration of a semiconductor integrated device 1 according to an eighth embodiment of the present invention. The semiconductor integrated device 1 according to the present eighth embodiment includes the input circuit 100, the reference signal generator 200, the input switching circuit 300, the semiconductor circuit 400, the initial value storage circuit 500, the difference operation circuit 600, a threshold generation circuit 702, a determination circuit 703, and the write circuit S3. The functions of the input circuit 100, the reference signal generator 200, the input switching circuit 300, the initial value storage circuit 500, the difference operation circuit 600, and the write circuit S3 are basically similar to those of the first embodiment, and thus different points about the other configurations will be described below.

In the present eighth embodiment, unlike the first embodiment, the semiconductor circuit 400 does not include the correction circuit 800. Accordingly, the difference operation circuit 600 calculates a difference between the output 403 from the semiconductor circuit 400 and the initial value Y1 stored in the initial value storage circuit 500.

The threshold generation circuit 702 generates a threshold value previously set, and generates an output 704 representing the threshold value. The determination circuit 703 compares the output 601 from the difference operation circuit 600 and the output 704 from the threshold generation circuit 702, and outputs a determination result 705.

Figure 22:
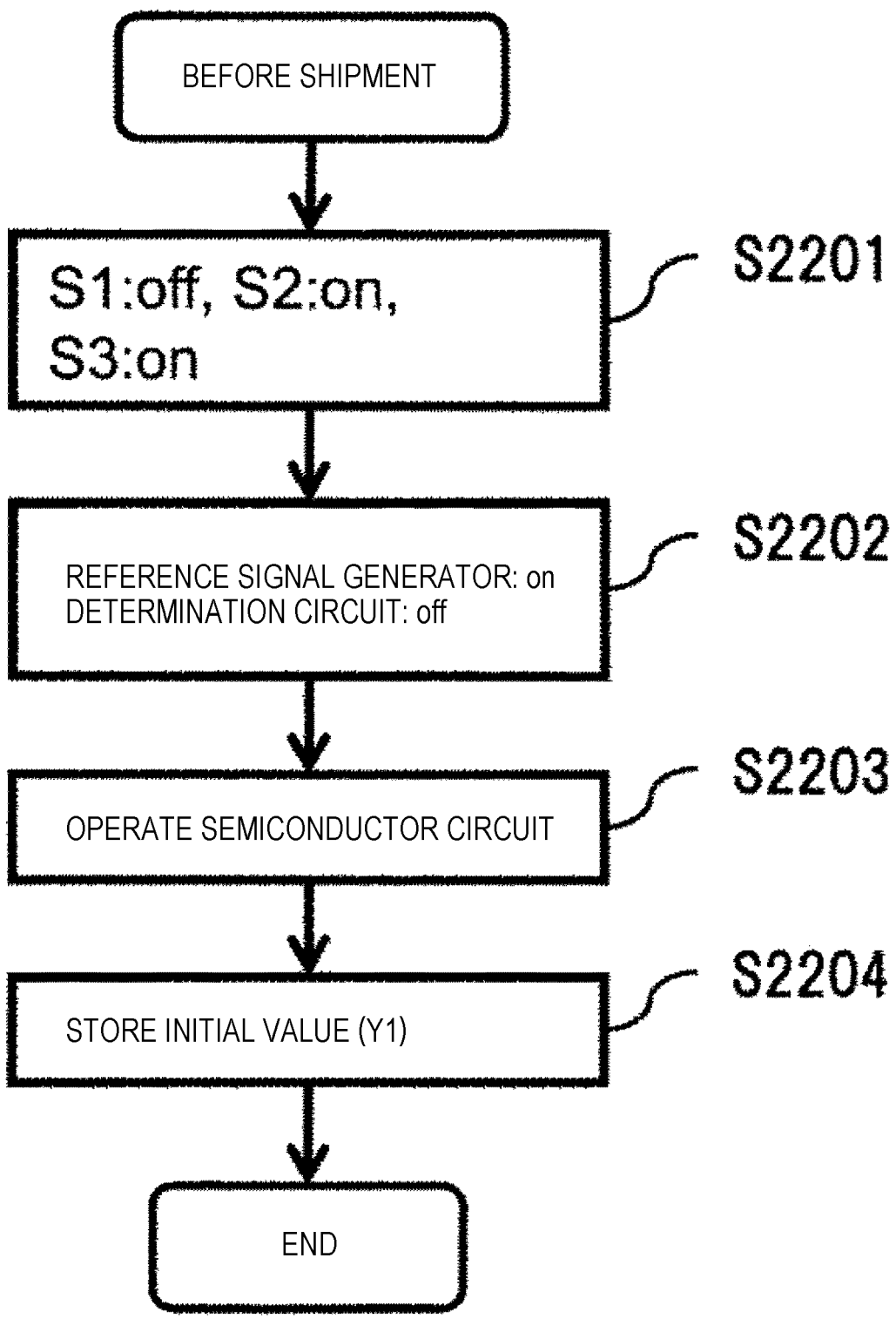
FIG. 22 is a flowchart illustrating operation of the semiconductor integrated device 1 before shipment.

FIG. 22 is a flowchart illustrating operation of the semiconductor integrated device 1 before shipment. Before shipment, the semiconductor integrated device 1 turns off the switching circuit S1, turns on the switching circuit S2, and turns on the write circuit S3 (S2201). The semiconductor integrated device 1 activates the reference signal generator 200, and turns off the determination circuit 703 (S2202). When the semiconductor circuit 400 is operated in this condition (S2203), the semiconductor circuit 400 outputs an output value Y1 according to the reference signal 201 from the reference signal generator 200, and Y1 is stored in the initial value storage circuit 500 (S2204). The steps of the flowchart of FIG. 22 are preferably performed, for example, in a release test for the semiconductor integrated device 1, as in FIG. 2.

Figure 23:
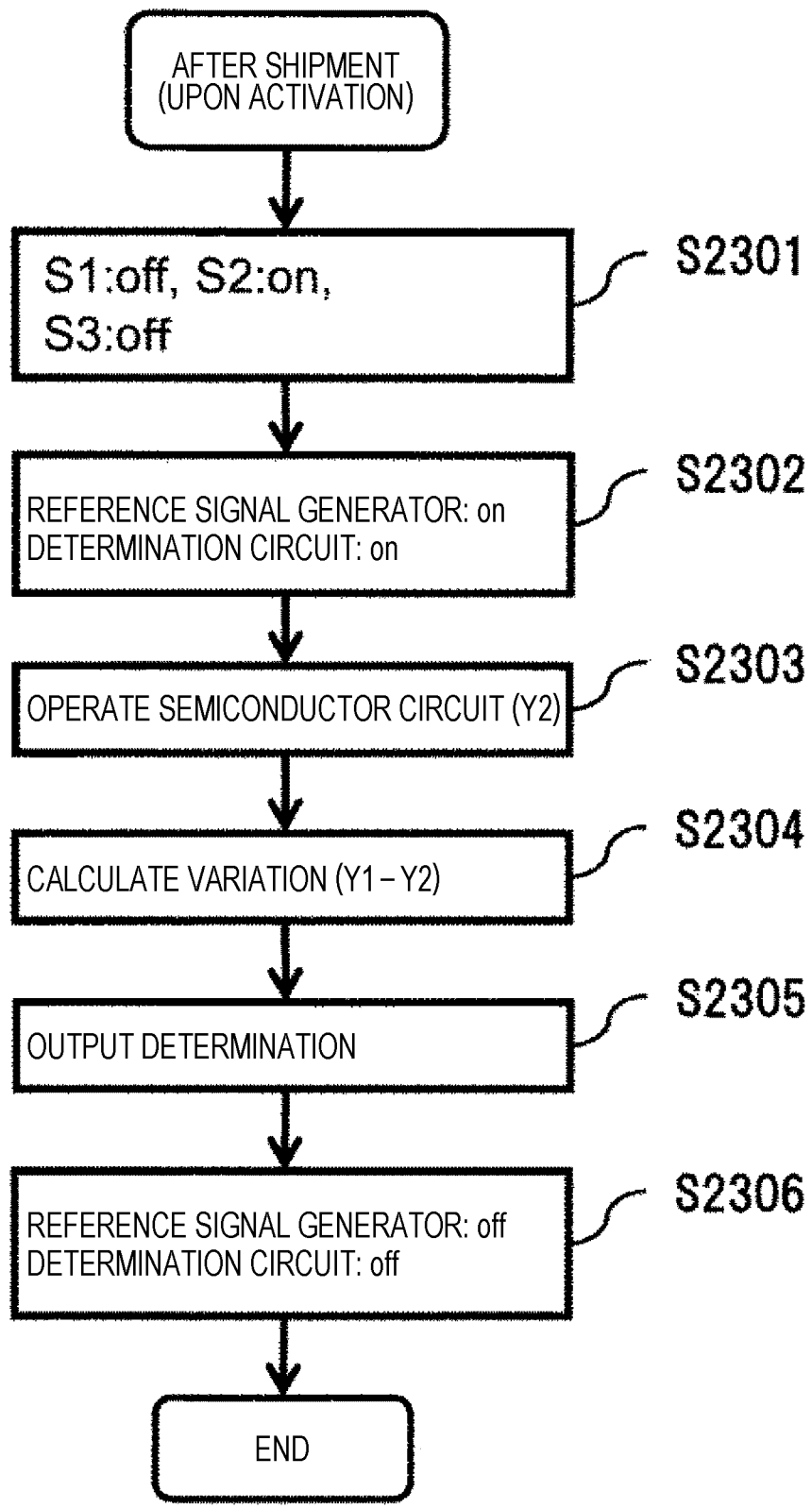
FIG. 23 is a flowchart illustrating operation of the semiconductor integrated device 1 after shipment.

FIG. 23 is a flowchart illustrating operation of the semiconductor integrated device 1 after shipment. The steps of the flowchart of FIG. 23 are preferably performed, for example, upon activation of the semiconductor integrated device 1, as in FIG. 3.

The semiconductor integrated device 1 turns off the switching circuit S1, turns on the switching circuit S2, and turns off the write circuit S3 (S2301). The semiconductor integrated device 1 activates the reference signal generator 200 and the determination circuit 703 (S2302). When the semiconductor circuit 400 is operated in this condition, the semiconductor circuit 400 outputs an output value Y2 according to the reference signal 201 from the reference signal generator 200 (S2303). The difference operation circuit 600 calculates a difference between Y2 and the output 501 representing a value stored in the initial value storage circuit 500 at a time point before shipment, and transmits the output 601 representing a result of the calculation to the determination circuit 703 (S2304). The determination circuit 703 outputs a result of comparison between the outputs 601 and 704 (S2305). The semiconductor integrated device 1 turns off the reference signal generator 200 and the determination circuit 703 (S2306).

When the semiconductor integrated device 1 according to the present eighth embodiment is mounted, for example, to a vehicle-mounted control device, the controller of the vehicle-mounted control device can determine an abnormal condition of the semiconductor integrated device 1 on the basis of the determination result 705. Thus, error notification of for example turning on of an alarm indicator can be made.

Figure 24:
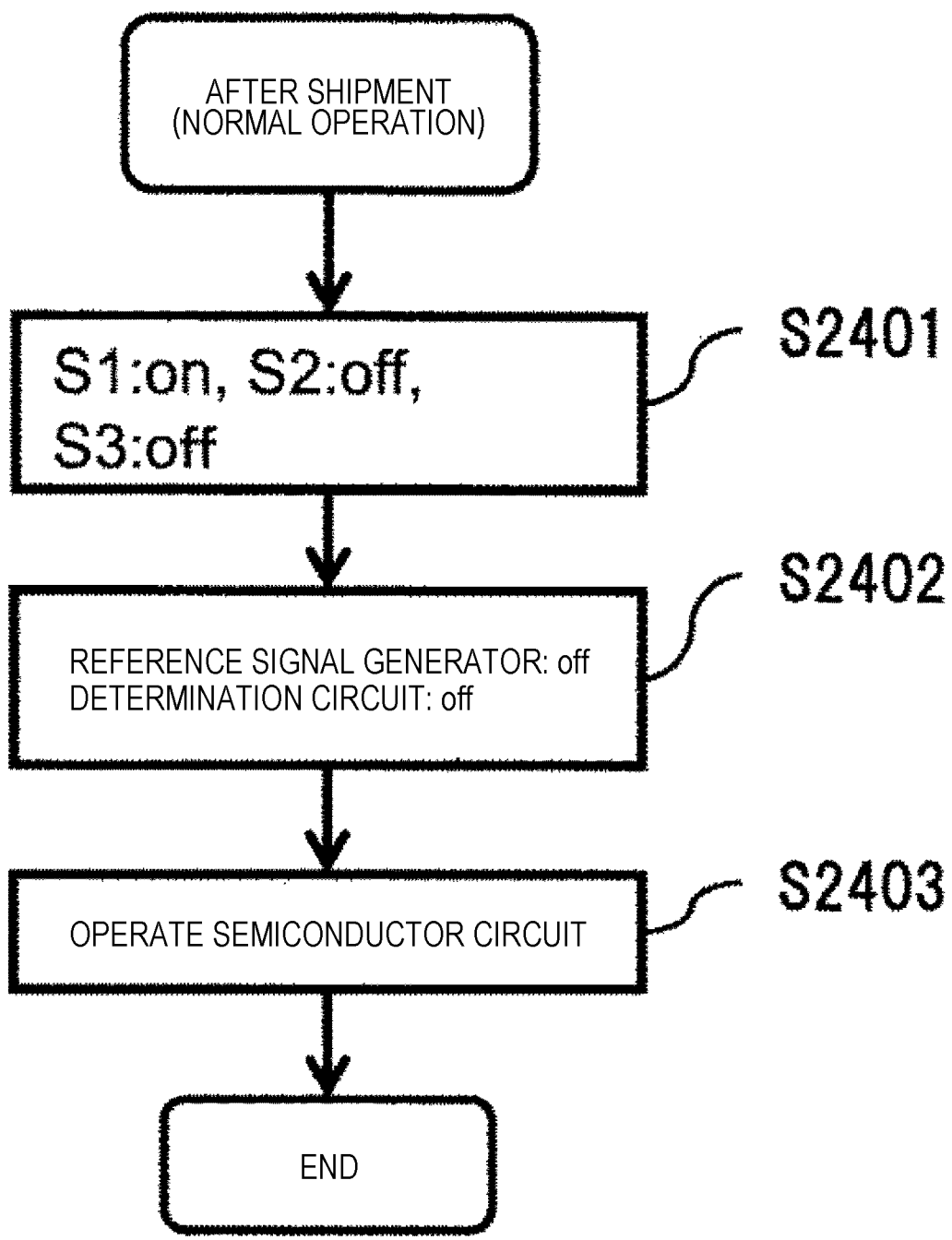
FIG. 24 is a flowchart illustrating operation of the semiconductor integrated device 1 after shipment.

FIG. 24 is a flowchart illustrating operation of the semiconductor integrated device 1 after shipment. The flowchart of FIG. 24 illustrates the steps of correcting a characteristic variation of the semiconductor circuit 400 over time during normal operation of the semiconductor integrated device 1.

The semiconductor integrated device 1 turns on the switching circuit S1, turns off the switching circuit S2, and turns off the write circuit S3 (S2401). The semiconductor integrated device 1 turns off the reference signal generator 200 and the determination circuit 703 (S2402). The semiconductor integrated device 1 operates the input circuit 100 and the semiconductor circuit 400 (S2403). The operations of the initial value storage circuit 500, the difference operation circuit 600, the determination circuit 703, and the threshold generation circuit 702 are stopped, and thereby the age deterioration of these circuits can be also prevented, as in the first embodiment.

Eighth Embodiment: Effects

As described above, the semiconductor integrated device 1 according to the present eighth embodiment can detect the age deterioration of the semiconductor circuit 400 by using the determination circuit 703. Furthermore, on the basis of a detection result, the following measures can be taken (a) reporting an abnormal condition of the semiconductor circuit 400 to a vehicle driver, (b) recording an abnormal log, or (c) performing fail-safe processing (e.g., suspending control of a vehicle-mounted device or a vehicle).

Modifications of the Present Invention

The present invention is not limited to the examples described above, and can include various modifications. For example, the above examples are described in detail for convenience to understand the present invention, and therefore, the present invention is not necessarily limited to a configuration including all of the configurations described above. Furthermore, part of a configuration according to an example can be replaced with a configuration according to another example, and a configuration according to an example can be also applied to a configuration according to another example. In addition, for part of a configuration according to each example, addition, elimination, or substitution of another configuration may be made.

In the above embodiments, control lines or information lines considered to be necessary for description are described, and all control lines or information lines required for a product are not always illustrated. Any of analog signal and digital signal can be input to or output from each component circuit, with similar effects. The component elements of the semiconductor integrated device 1 may be formed on the same semiconductor chip to be configured as an integrated circuit, or may be separated to be mounted as a plurality of components.

In the above embodiments, the operation of the semiconductor integrated device 1 may be controlled in accordance with a command from a calculation control device such as the controller 900 or the semiconductor integrated device 1 may include a control device for controlling the operation of the semiconductor integrated device 1.

REFERENCE SIGNS LIST 1 semiconductor integrated device
100 input circuit
200 reference signal generator
300 input switching circuit
400 semiconductor circuit
500 initial value storage circuit
503 temperature monitor circuit
505 selector circuit
600 difference operation circuit
700 correction-value storage circuit
702 threshold generation circuit
703 determination circuit
800 correction circuit
900 controller

The invention claimed is:

1. A vehicle-mounted control device for controlling the operation of a vehicle-mounted device mounted on a vehicle, comprising:
a semiconductor circuit which outputs an output value used for the controlling;
an input circuit which provides the output value as a first input value to the semiconductor circuit
a reference signal generator which generates a reference signal as a second input value to the semiconductor circuit;
an input switching circuit which switches an input value to transmit the first input value or the second input value to the semiconductor circuit
a comparison unit which determines a difference between a first output value output from the semiconductor circuit upon input of the reference signal to the semiconductor circuit by the reference signal generator at a time point before shipment of the vehicle-mounted control device, and a second output value output from the semiconductor circuit upon input of the reference signal to the semiconductor circuit by the reference signal generator at a time point that activation of the vehicle-mounted control device after a time point at which the semiconductor circuit outputs the first output value, and a correction unit which corrects the output value from the semiconductor circuit at a time point after activation of the vehicle-mounted control device, on the basis of the difference determined by the comparison unit, the vehicle-mounted control device includes:

an age-deterioration inhibition unit which stops the operation of the reference signal generator while the reference signal generator does not output the reference signal to the semiconductor circuit to prevent age deterioration of the reference signal generator.

2. The vehicle-mounted control device according to claim 1, wherein the vehicle-mounted control device includes an initial value storage unit which stores the first output value, the comparison unit determines the difference between the first output value stored in the initial value storage unit and the second output value output from the semiconductor circuit upon activation of the vehicle-mounted control device.

3. The vehicle-mounted control device according to claim 2, wherein the age-deterioration inhibition unit stops power supply to the reference signal generator or stops driving a switching element of the reference signal generator to stop the operation of the reference signal generator.

4. The vehicle-mounted control device according to claim 3, wherein the semiconductor circuit, the comparison unit, and the age-deterioration inhibition unit are mounted in the same semiconductor integrated circuit.

5. The vehicle-mounted control device according to claim 1, wherein the vehicle-mounted control device includes a calculation unit which performs control calculation for controlling the operation of the vehicle-mounted device, and between the reference signal generator and the calculation unit, a heat insulating portion is arranged which prevents propagation of heat generated from the calculation unit to the reference signal generator.

6. The vehicle-mounted control device according to claim 1, wherein the semiconductor circuit is configured as a circuit which outputs an analog signal, the vehicle-mounted control device includes an analog to digital (AD) converter which converts an analog signal output from the semiconductor circuit to a digital signal, and the comparison unit determines the difference between the first and second output values converted to digital signals by the AD converter.

7. The vehicle-mounted control device according to claim 1, wherein the vehicle-mounted control device includes:

a temperature monitor which measures a temperature of the semiconductor circuit;

an initial value storage unit which stores at least one pair of the first output value and a temperature of the semiconductor circuit upon output of the first output value by the semiconductor circuit; and a selector which selects one, from the at least one pair of the first output value and a temperature of the semiconductor circuit stored in the initial value storage unit, corresponding to a measurement result from the temperature monitor, and the comparison unit determines the difference between the first output value selected by the selector and the second output value.

8. The vehicle-mounted control device according to claim 1, wherein the vehicle-mounted control device includes:

a second reference signal generator which generates a second reference signal as an input value to the semiconductor circuit; and an initial value storage unit which stores the first output value and a third output value output from the semiconductor circuit upon input of the second reference signal to the semiconductor circuit by the second reference signal generator, and the comparison unit determines a second difference between the second output value and a fourth output value output from the semiconductor circuit upon input of the second reference signal to the semiconductor circuit by the second reference signal generator, at a time point after a time point at which the semiconductor circuit outputs the third output value, a third difference between the first output value and the third output value, and a gain variation of the semiconductor circuit after outputting the first output value from the semiconductor circuit and before outputting the second output value, or a gain variation of the semiconductor circuit after outputting the third output value from the semiconductor circuit and before outputting the fourth output value, on the basis of a ratio between the second difference and the third difference.

9. The vehicle-mounted control device according to claim 1, wherein the correction unit outputs a correction value which corrects the output value from the semiconductor circuit on the basis of the difference determined by the comparison unit, and the semiconductor circuit includes a regulation unit which regulates the output value in accordance with the correction value output from the correction unit.

10. The vehicle-mounted control device according to claim 1, wherein the vehicle-mounted control device includes a calculation unit which performs control calculation for controlling the vehicle-mounted device, and the correction unit is mounted in the calculation unit.

11. A vehicle-mounted integrated circuit mounted to a vehicle, comprising:

a semiconductor circuit which outputs an output value used for the controlling;

an input circuit which provides the output value as a first input value to the semiconductor circuit a reference signal generator which generates a reference signal as a second input value to the semiconductor circuit;

an input switching circuit which switches an input value to transmit the first input value or the second input value to the semiconductor circuit a comparison unit which determines a difference between a first output value output from the semiconductor circuit upon input of the reference signal to the semiconductor circuit by the reference signal generator at a time point before shipment of the vehicle-mounted integrated circuit, and a second output value output from the semiconductor circuit upon input of the reference signal to the semiconductor circuit by the reference signal generator at a time point that activation of the vehicle-mounted integrated circuit after a time point at which the semiconductor circuit outputs the first output value, and a correction unit which corrects an output value from the semiconductor circuit at a time point after activation of the vehicle-mounted integrated circuit, on the basis of the difference determined by the comparison unit, the vehicle-mounted control device includes:

an age-deterioration inhibition unit which stops the operation of the reference signal generator while the reference signal generator does not output the reference signal to the semiconductor circuit to prevent age deterioration of the reference signal generator.

* * * * *